United States Patent [19]

Jaafar et al.

[11] Patent Number: 4,970,890

[45] Date of Patent: Nov. 20, 1990

[54] ELECTRIC GENERATOR INSPECTION SYSTEM

[75] Inventors: Hamedo A. Jaafar, Westtown; Karl A. Katzor, West Goshen; Wilbert B. Rethage, Apollo; Gerard A. Pompa, Cheswick; George F. Dailey, Plum; Paul Guenther, Aston, all of Pa.

[73] Assignee: Westinghouse Electric Corp., Pittsburgh, Pa.

[21] Appl. No.: 353,306

[22] Filed: May 17, 1989

Related U.S. Application Data

[62] Division of Ser. No. 277,472, Nov. 23, 1988, Pat. No. 4,889,000.

[51] Int. Cl.⁵ .............................................. G01N 3/08
[52] U.S. Cl. .................................................. 73/012
[58] Field of Search .................. 73/865.8, 12, 572, 12; 358/100, 106, 107, 108; 324/158 MG, 551, 545

[56] References Cited

U.S. PATENT DOCUMENTS

| | | |
|---|---|---|
| 1,358,179 | 11/1920 | Schweitzer . |
| 1,945,263 | 1/1934 | Doble . |
| 2,599,960 | 6/1952 | Weichsel . |
| 2,741,738 | 4/1956 | Reid . |
| 2,837,714 | 6/1958 | Hill . |
| 3,097,523 | 7/1963 | Diamond et al. . |
| 3,879,982 | 4/1975 | Schmidt . |
| 4,139,822 | 2/1979 | Urich et al. . |
| 4,230,961 | 10/1980 | Calfo et al. . |
| 4,272,781 | 6/1981 | Taguchi et al. . |
| 4,368,642 | 1/1983 | Carodiskey . |
| 4,394,683 | 7/1983 | Liptay-Wagner et al. ......... 358/107 |
| 4,422,320 | 12/1983 | Moorby et al. . |
| 4,429,575 | 2/1984 | Akishika . |
| 4,456,934 | 6/1984 | Wedman et al. . |
| 4,502,329 | 3/1985 | Fukunaga et al. . |
| 4,502,331 | 3/1985 | Singh et al. . |
| 4,534,206 | 8/1985 | Kiso et al. . |
| 4,542,639 | 9/1985 | Cawley et al. . |
| 4,604,896 | 8/1986 | Taschner et al. . |
| 4,615,209 | 10/1986 | Change, Jr. . |
| 4,629,984 | 12/1986 | Scalise . |
| 4,709,582 | 12/1987 | Besanceney . |
| 4,779,975 | 10/1988 | Kim ..................................... 356/350 |

FOREIGN PATENT DOCUMENTS

2492527 4/1982 France .
627393 8/1978 U.S.S.R. .

OTHER PUBLICATIONS

Paper presented at EPRI Conference, Sep. 1986, San Antonio, Texas, entitled "Remote Inspection of Steam Turbine Blades".

*Primary Examiner*—Robert Raevis

[57] ABSTRACT

An inspection system inspects the interior of the stator of an electric generator for the existence of several problems. The inspection apparatus is mounted on a carriage that travels along the slots defined by the stator. An indexer is mounted to the rotor of the generator and can travel around the circumference of the rotor to deliver the carriage to the desired slot. An indexer plate is mounted to the indexer and can be registered with the desired slot to insure that the carriage can enter the slot from the indexer. An associated motor controller disables the motor if an electrical fault is disclosed.

21 Claims, 16 Drawing Sheets

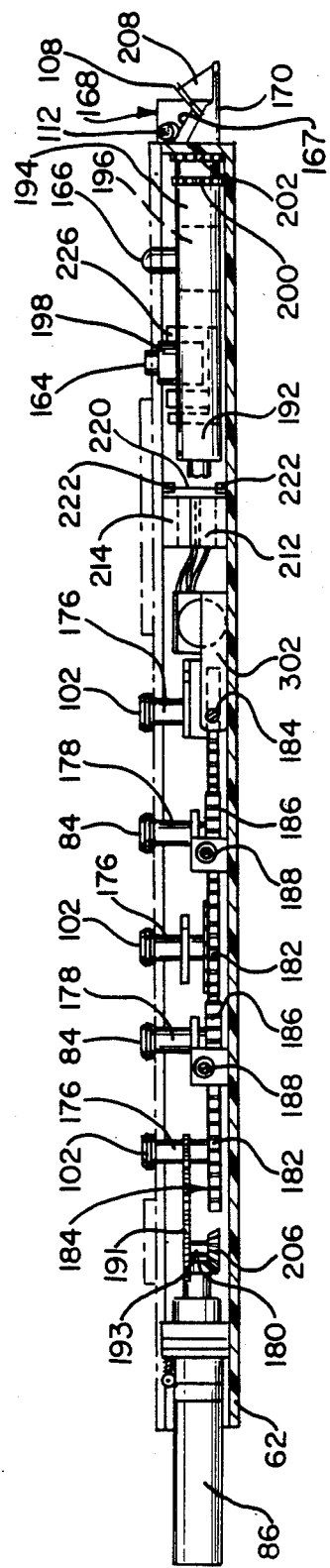
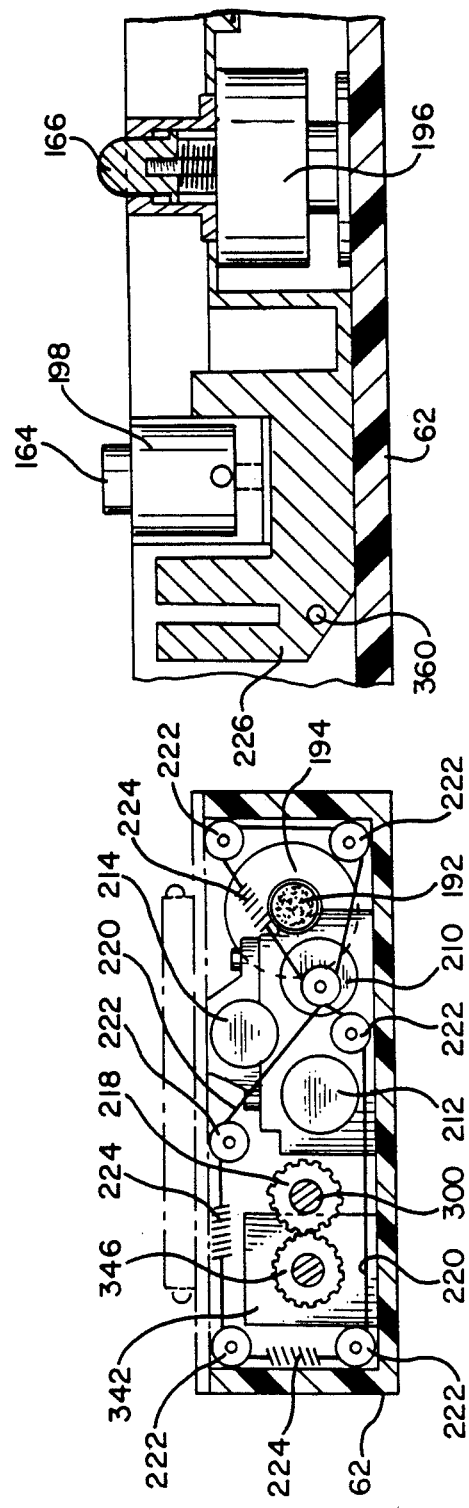
FIG. 9
FIG. 10
FIG. 11

ELECTRIC GENERATOR INSPECTION SYSTEM

This is a division of application Ser. No. 07/277,472 filed Nov. 23, 1988, now U.S. Pat. No. 4,889,000.

BACKGROUND OF THE INVENTION

1. Field of the Invention

The present invention pertains to a remote inspection of electric generators without disassembly, and a motor controller, and particularly to an automatic inspection system.

2. Description of the Prior Art

Two major problems commonly develop in the stator of electric generators after they have been in operation for some time. First, the insulation between stator laminations can break down. Second, the stator coil wedges, which are located within the slots defined by the stator and prevent the stator coils from vibrating, can become loose. Further, miscellaneous problems that can be detected visually can occur within the stator.

Tests have been developed to determine the existence of the problems described above. However, such tests are conducted manually and require removal of the rotor from within the stator. Rotor removal is a long and involved process. Removing the rotor, manually performing the test, and replacing the rotor can often consume ten to fourteen days. Removing the generator from service for such a period imposes serious problems on those relying on operation of the generator. Further, removing the rotor from the stator can itself cause damage to the stator. Also, replacing the rotor can damage the stator and a stator that has passed inspection may in fact be defective after rotor replacement has damaged the stator.

Accordingly, there exists a need for an inspection system for an electric generator that does not require removal of the rotor from within the stator to perform the inspection.

SUMMARY OF THE INVENTION

The present invention provides a system for inspecting an electric generator. The system includes apparatus for inspecting and providing information pertaining to the tightness of the stator coil wedges of the generator. The system also includes apparatus for inspecting and providing information pertaining to the electrical integrity of the stator lamination insulation. The system further includes apparatus for visually and remotely inspecting the interior of the surfaces of the stator and the rotor of the generator. The system includes apparatus for delivering each inspecting apparatus to the site of inspection and for retrieving the apparatus therefrom. The system also includes apparatus for causing each inspection apparatus to conduct an inspection at an inspection site.

The present invention provides a further inspection system for an electric generator. The system includes apparatus for inspecting and providing information pertaining to the tightness of the stator coil wedges of the generator. The system further includes apparatus for delivering the inspection apparatus to the site of inspection and for retrieving the inspection apparatus therefrom. The system also includes apparatus for causing the inspection apparatus to conduct an inspection at an inspection site.

The present invention provides a further inspection system for an electric generator. The system includes apparatus for inspecting and providing information pertaining to the electrical integrity of the stator lamination insulation of the generator. The system also includes apparatus for delivering the inspection apparatus to the site of inspection and for retrieving the inspection apparatus therefrom. The system also includes apparatus for causing the inspection apparatus to conduct an inspection at an inspection site.

The present invention provides a further inspection system for an electric generator. The system includes an apparatus for visually and remotely inspecting the interior surfaces of the stator and of the outer surface of the rotor of the generator. The system includes apparatus for delivering the inspection apparatus to the site of inspection and for retrieving the apparatus therefrom. The system further includes apparatus for causing the inspection apparatus to conduct an inspection at an inspection site.

The present invention provides a further inspection system for an electric generator. The system includes a carriage adapted to travel along the slots defined by the stator of the generator. Apparatus is mounted on the carriage for inspecting and providing information pertaining to the tightness of the stator coil wedges of the generator. Apparatus is provided for moving the carriage along the stator slots to sites of inspection. An indexer is adapted to be releasably secured to the rotor of the generator. The carriage and the indexer are adapted to permit the carriage to be received and retained by the indexer when the carriage exits a slot. Apparatus is provided for aligning the indexer with each slot to permit the carriage to enter the slot when the carriage travels out of retention of the indexer. Apparatus is provided for moving the indexer around the circumference of the rotor to deliver the carriage to a desired slot. Apparatus is provided for causing the inspection apparatus to conduct an inspection at an inspection site.

The present invention provides a further inspection system for an electric generator. The system includes a carriage adapted to travel along the slots defined by the stator of the generator. Apparatus is mounted on the carriage for inspecting and providing information pertaining to the electrical integrity of the stator lamination insulation.

Apparatus is provided for moving the carriage along the stator slots to sites of inspection. An indexer is adapted to be releasably secured to the rotor of the generator. The carriage and the indexer are adapted to permit the carriage to be received and retained by the indexer when the carriage exits a slot.

Apparatus is provided for aligning the indexer with each slot to permit the carriage to enter the slot when the carriage travels out of retention of the indexer. Apparatus is provided for moving the indexer around the circumference of the rotor to deliver the carriage to a desired slot. Apparatus is provided for causing the inspection apparatus to conduct an inspection at an inspection site.

The present invention provides a further inspection system for an electric generator. The system includes a carriage adapted to travel along the slots defined by the stator of the generator. Apparatus is mounted on the carriage for visually and remotely inspecting the interior surfaces of the stator and of the rotor of the generator. Apparatus is provided for moving the carriage along the stator slots to sites of inspection. An indexer is adapted to be releasably secured to the rotor of the generator. The carriage and the indexer are adapted to permit the carriage to be received and retained by the indexer when the carriage exits a slot.

Apparatus is provided for aligning the indexer with each slot to permit the carriage to enter the slot when the carriage travels out of retention of the indexer. Apparatus is provided for moving the indexer around the circumference of the rotor to deliver the carriage to a desired slot. Apparatus is provided for causing the inspection apparatus to conduct an inspection at an inspection site.

The present invention provides a further inspection system for an electric generator. The system includes a carriage adapted to travel along the slots defined by the stator of the generator. Apparatus is mounted on the carriage for inspecting and providing information pertaining to the tightness of the stator coil wedges of the generator and the electrical integrity of the stator lamination insulation and for visually and remotely inspecting the interior surfaces of the stator. Apparatus is provided for moving the carriage along the stator slots to sites of inspection. An indexer is adapted to be releasably secured to the rotor of the generator. The carriage and the indexer are adapted to permit the carriage to be received and retained by the indexer when the carriage exits a slot.

Apparatus is provided for aligning the indexer with each slot to permit the carriage to enter the slot when the carriage travels out of retention of the indexer. Apparatus is provided for moving the indexer around the circumference of the rotor to deliver the carriage to a desired slot. Apparatus is provided for causing the inspection apparatus to conduct an inspection at an inspection site.

The present invention further provides a motor controller. The controller includes a source of energizing power for the motor and a pulse width modulator for controlling application of the power source to the motor. The modulator includes a transistor H-bridge. The controller also includes apparatus for detecting an electrical fault in the motor, for disabling the motor upon occurrence of the fault, and for preventing the motor from being restarted until a reset switch is actuated. Preferably, the controller includes apparatus for limiting the maximum current that can flow into the motor. Also, preferably, the controller determines that a fault exists when the currents entering and exiting the motor are not substantially equal to each other.

BRIEF DESCRIPTION OF THE DRAWINGS

The invention may be better understood, and further advantages and uses thereof are readily apparent, when considered in view of the following detailed description of exemplary embodiments, taken with the accompanying drawings in which:

FIG. 9 is a sectional view of the carriage shown in FIG. 8, taken along line IX—IX;

FIG. 10 is a sectional view of the carriage shown in FIG. 8, taken along the line X—X;

FIG. 11 is a sectional view of the carriage shown in FIG. 8, taken along the line XI—XI;

FIG. 21 is a schematic diagram of the acoustic signal conditioning circuit of the module shown in FIG. 15.

DETAILED DESCRIPTION OF THE PREFERRED EMBODIMENTS

Figure 1:
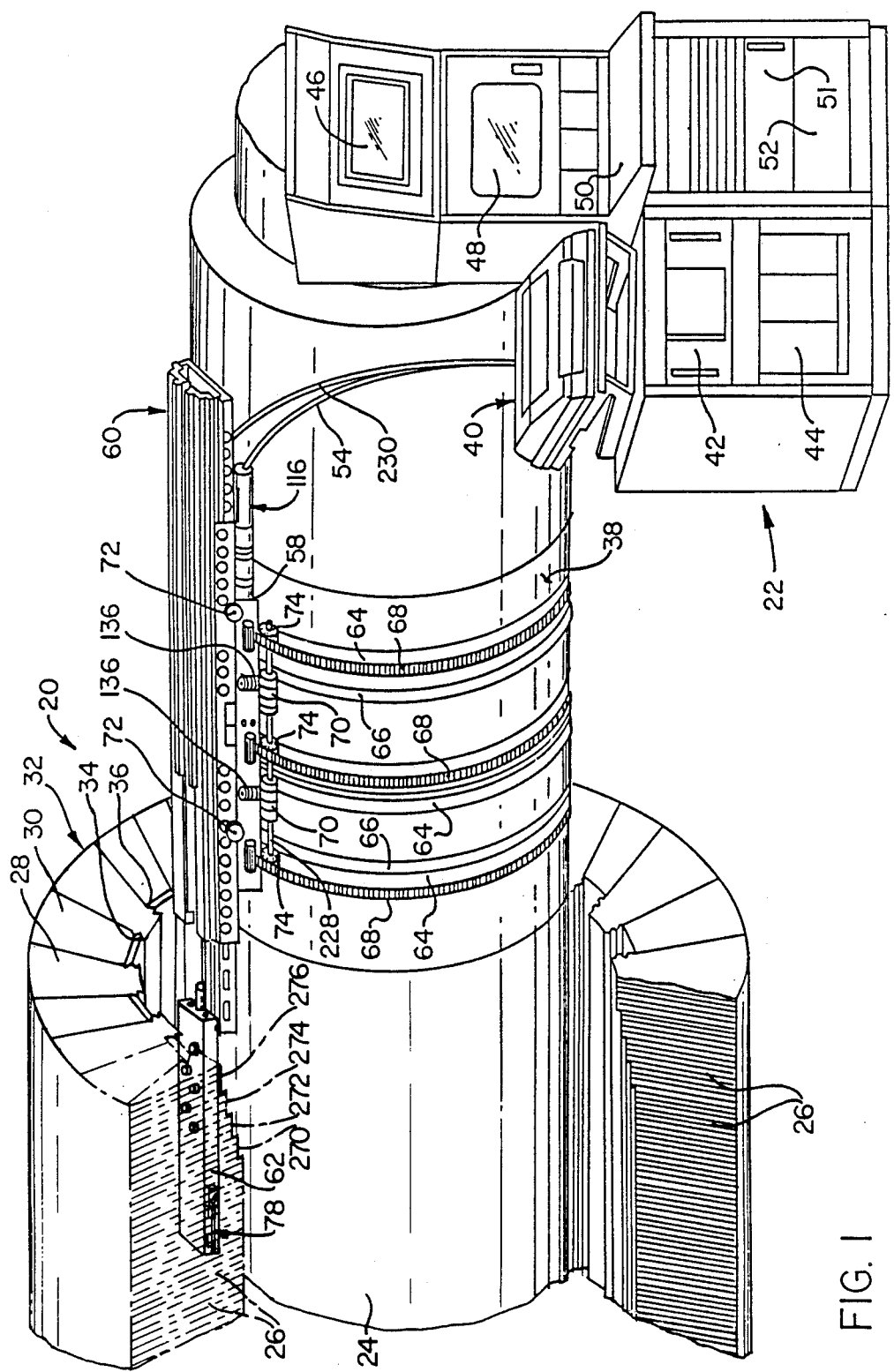
FIG. 1 is a perspective view of a generator with the inspection system, constructed according to the provisions of the present invention.

FIG. 1 shows a generator inspection assembly that is used to remotely inspect the stator of an electric generator. The inspection assembly includes, generally, a carriage assembly, an indexer plate, and an indexer. The carriage includes inspection apparatus and is adapted to travel along the stator. The indexer is adapted to move around the rotor to deliver the carriage to a desired slot of the stator. The indexer plate is adapted to move somewhat and provides positive registration between the indexer and the slot. A computer and video system permits electrical and visual data generated by the generator inspection to be recorded for real-time or post-inspection analysis.

The carriage contains several subassemblies that perform inspection or testing and that move the carriage assembly within the stator of a generator. The teeth that make up some generators contain two sets of grooves. In those generators, a bottom set receives wedges that retain stator coils in the slots between the teeth and prevents them from vibrating. A top set permits the carriage to travel along the length of the stator teeth on wheels attached to the top of the carriage. As the carriage travels the length of the generator on the top set of stator teeth slots, or grooves, inspection of the stator is accomplished. The location of the carriage within the generator is continuously monitored to permit the operator to know the exact location of any portion of the stator that is damaged.

The carriage is housed prior to generator testing in the indexer plate. The indexer plate, which is housed within the indexer, positions the carriage at the active end of the generator such that the drive wheels of the carriage are aligned between the top set of grooves on the stator teeth. The indexer plate and carriage assemblies rotate around the rotor on the indexer assembly.

The indexer travels on chains which traverse the circumference of the rotor retaining ring. The chains are wrapped around the rotor retaining ring only when generator testing is being performed. The indexer, which is computer controlled, travels on the chains, stopping at every slot that is to be tested When generator inspecting is desired, the upper bearing bracket on the generator housing is removed and a belt is wrapped and secured around the rotor retaining ring. The belt provides tracks which permit the chains to remain parallel to each other so the indexer does not jam as it travels around the rotor. The belt is secured to the rotor retaining ring by passing strips of material over the belt and fastening the ends together with a conventional fastening device sold under the trademark "VELCRO" Once the belt is secured to the rotor retaining ring, chains are placed in the tracks on the belt. The indexer is mounted to the belt and the chains are threaded through the indexer on gears attached to the indexer. The ends of each chain are fastened together with a clasp.

Once the indexer is installed on the rotor retaining ring, the indexer plate is mounted to the indexer. Prior to mounting the indexer plate to the indexer, the carriage is slid into the indexer plate, with the end containing the camera positioned toward the generator, that is, the camera confronts the generator. Various electrical and video connections are made to the carriage and indexer The indexer plate is adjusted to a level alignment plane using jack screws such that the carriage will be in proper position to travel down the top tracks of the stator teeth and perform the necessary inspections The alignment of the carriage in the indexer plate is accomplished by placing the drive wheels of the carriage in a grooved section of the indexer plate. Once the indexer plate, with its carriage assembly, is attached to the indexer, the inspection can begin The indexer is positioned, by the operator and the computer, to the first slot to be tested Once the indexer is positioned, the indexer plate is driven by a motor along the indexer until registration with the stator is achieved. To prevent indexer plate contact with the stator, non-contact proximity sensors are employed to determine when the end of the indexer plate just enters the slot. When the indexer plate is in registration with the slot, the carriage is aligned properly with the slot. A signal is sent to the computer indicating proper alignment. The operator commands the computer to move the carriage, and the computer generates a signal that causes the carriage to move out of the indexer plate and into the top stator slot grooves, driven by the carriage drive wheels. Inspection of the stator takes place once the carriage is disposed within the stator teeth.

Three inspections are performed within the stator slots. A visual inspection is performed by the camera assembly. A stator lamination insulation integrity test is performed by the lamination integrity ("LI") assembly. A wedge tightness test is performed by the wedge tightness ("WT") assembly Visual inspection is done to determine whether there are any problems of a gross nature existing within the generator. A mirror assembly is connected to a camera such that the entire interior of the stator slot and of the rotor can be visually scanned. A video signal is sent back to the computer and video system to permit real-time and post-inspection analysis The lamination integrity ("LI") inspection may be performed at the same time the visual inspection takes place. Detectors, known to those skilled in the art as "ELCID" detectors, a trademark of the Central Generation Electrical Board of Great Britain and manufactured by Adwel Industries, Limited, Ruislip, London, England, measure fault currents which are generated when there is a breakdown of insulation between two or more adjacent laminates that make up the teeth of the stator.

The wedge tightness ("WT") inspection determines whether the stator coil wedges remain wedged sufficiently tightly within the stator slots. When the stator coils are mounted in the slots of the stator, they are secured in place with a wedge plate, which fits in the bottom set of slots of the stator teeth. The wedge must be tight to prevent slippage or vibration of the stator coil during generator use. The WT inspection checks for a loose wedge by impacting the wedge and recording and analyzing the acoustic signal produced by the impact.

The WT assembly is delivered by the carriage to any desired location within the stator. To perform the inspection process, the WT is raised into positions and held by a constant current motor/circuit. A solenoid powered impactor is actuated to strike the wedge several times. Following this sequence, the data is collected by the FGI Computer System and the WT is lowered to its normal home position. The data is acquired in two modes, Acoustic Waveform and Zero-Slope.

The Acoustic Waveform is amplified and sampled by an A/D converter at a 50 KHz rate. 128 points are collected during each sequence. Then, the first seven zero-slope positions along the acoustic waveform are detected and marked. The elapsed time between each of the seven zero-slope positions is measured and recorded. This process is repeated for each test position along the wedge resulting in a matrix of strikes vs. zero-slope values. The high and low values in each column are discarded. The remaining values in each column are used to derive an adjusted average. This adjusted average has been experimentally proven to be inversely proportional to wedge tightness.

An encoder wheel on the carriage permits displaying for the operator the exact position of the carriage when it is engaged with the stator. Knowing the location of the carriage permits the operator to pinpoint problem areas without having to remove the rotor from the generator.

Although a detailed description of the inspection processes is provided during the discussion of the computer systems that controls the inspection apparatus, a general description of each inspection procedure is provided at this point. The LI inspection is conducted by the operator by moving the indexer around the rotor to the desired stator slot. When the desired stator slot has been reached by the indexer, the operator causes the indexer plate to move outward from the indexer until indexer plate registration with the stator slot is achieved Non-contact proximity sensors on the indexer plate are provided to permit a determination of registration to be made. When the indexer plate is in registration with the slot, the operator moves the carriage out of the indexer plate and into the stator slot. When the LI assembly, located on the carriage, reaches the inspection site, the carriage is stopped and the LI assembly is raised until it contacts the stator. The LI assembly includes ferrite plugs which actually contact the stator. Once contact with the ferrite plugs is achieved, the carriage is moved along the slot and lamination integrity data is gathered by the LI coils of the LI assembly and processed and displayed. At the end of the scan, the carriage can be returned to its home position, that is, the position in which it is located on the indexer plate The WT inspection is initiated by moving the indexer and indexer plate as described with reference to the LI inspection described above. The carriage is moved along the slot to the desired wedge, and the WT assembly is moved along the inspection site on the wedge. The WT assembly is raised to bring the impact of the assembly into a position where it can impact the wedge. The computer energizes the solenoid of the WT assembly which causes the impactor to strike the wedge The wedge is struck several times and an acoustic sensor on the WT assembly gathers acoustic data generated by those impacts The signal is conditioned by a conditioning circuit and transmitted to the computer for processing and display.

The camera assembly permits the operator to visually and remotely inspect the stator slots and the rotor for problems of a gross nature and to aid in positioning the carriage within the stator. The camera includes a lens that can be moved by the computer to adjust the focus of the camera The camera assembly includes a mirror that can be both rotated and tilted to permit viewing of the entire interior of the stator slot and of the rotor by the operator.

The details of the generator inspection assembly shown in FIG. 1 are presented below.

FIG. 1 shows a perspective view of generator 20 and computer and video system 22. Carriage 62 is shown engaged with teeth 28 of stator 32. Coil 30 is mounted between stator teeth 28, which is constructed from teeth laminates 26. Indexer 58 rides on chains 68 and causes indexer plate assembly 60, which acts as a housing for carriage 62 when carriage 62 is in its home, or passive, position, to travel around the circumference of rotor 24 along retaining ring 38. Indexer plate assembly 60 is secured to indexer 58 by cantilever spring fasteners 72. Fasteners 72 permit proper alignment of assembly 60 within indexer 58 regardless of the size of gap 80 between rotor 24 and stator 32 (See FIG. 2).

Indexer 58 travels over chains 68 by engaging gears 74 with chains 68. Gears 74 are rotated by rod 228, which is rotated by gear engagement 70. Gear engagements 70, driven by tangential drive motor 116, ensure proper lateral movement of indexer 58 as it rotates about rotor 24. Power to motor 116 is delivered through cable 54. Chains 68 fit into grooves on track belt 64, which is secured to rotor 24 with straps 66. Track belt 64 ensures proper alignment of chains 68 such that indexer 58 will not rotate unevenly around rotor 24. Proper tension of chains 68 is maintained by chain tensioners 136.

Electrical, video and control signals are transmitted to and from computer and video system 22 to indexer 58 and carriage 62 through cables 54 and 230, respectively (one of each shown). Video data on cables 54 and 230 are displayed on monitor 46 and recorded for further inspection on recorder 42, which is controlled by controller 44. Electrical signals are displayed on monitor 48 and may be stored on computer disk drive 51. Microprocessor, or computer, 52 permits computational analysis of the incoming electrical signals which can also be displayed on monitor 48 or downloaded to printer 40. Keyboard 50, which includes a full ASCII computer keyboard and an operator control panel, permits the operator of system 22 to control operation of carriage 62, indexer plate assembly 60, and indexer 58, as well as the LI assembly, the WT assembly, and the camera assembly.

Figure 2:
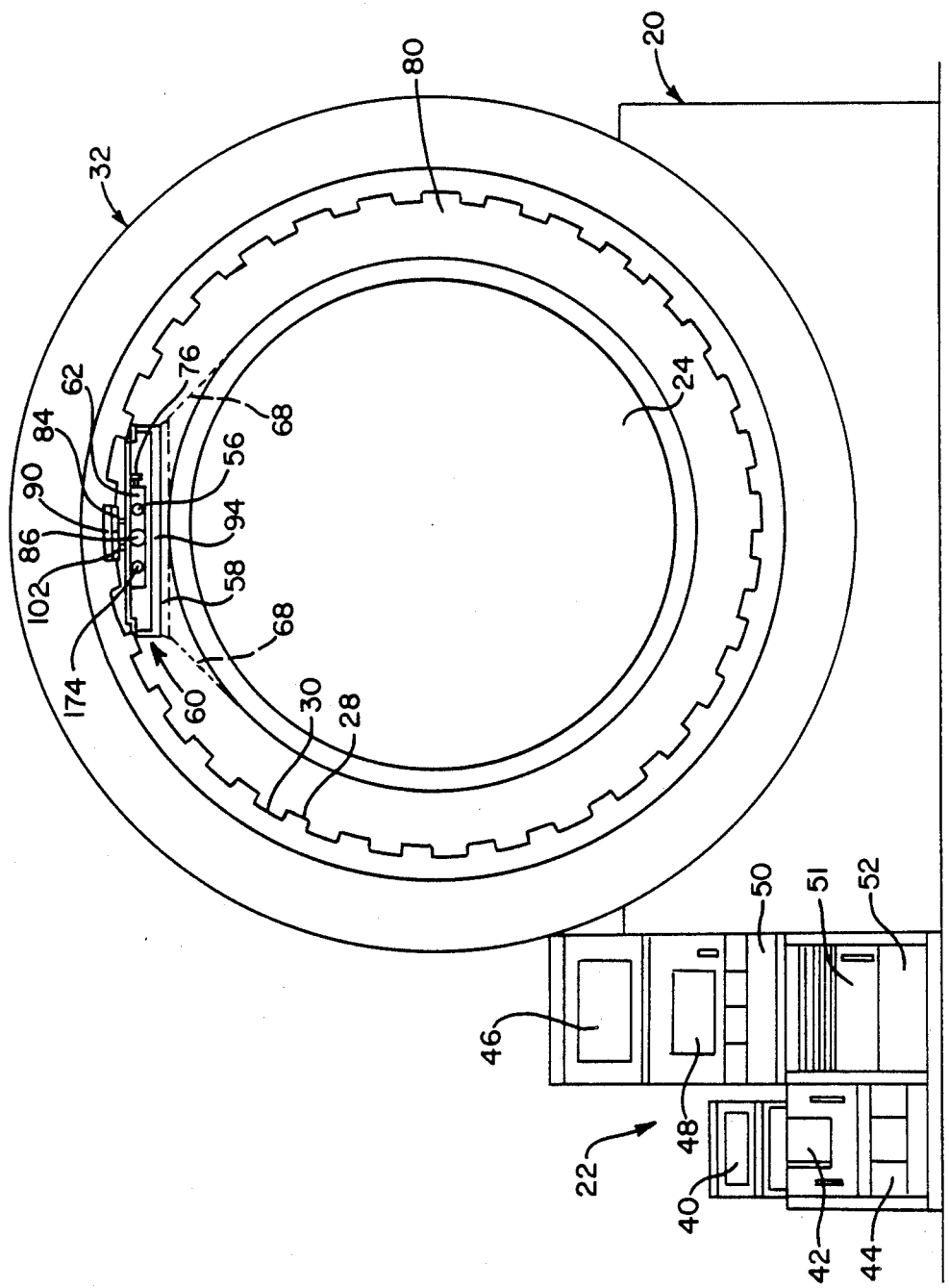
FIG. 2 is a schematic view of the generator with the inspection system shown in FIG. 1.
Figure 3:
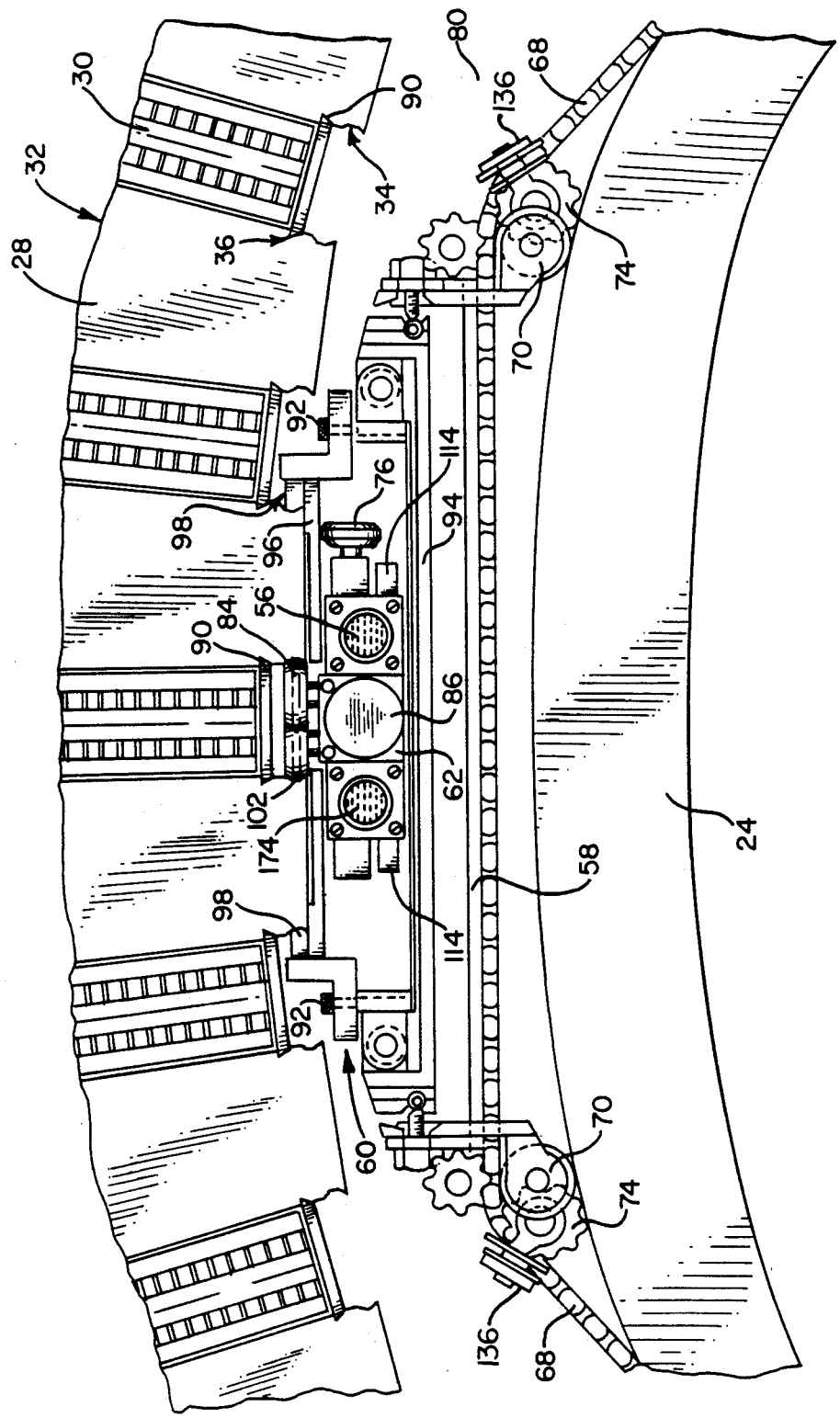
FIG. 3 is a partial rear elevational view of the inspection system shown in FIG. 1 engaged with the stator of a generator.

FIGS. 2 and 3 show end views of carriage 62, assembly 60, and indexer 58 engaged with stator 32. Encoder wheel 76 of carriage 62 provides information pertaining to the relative position of carriage 60 to the operator and ensure that carriage 62 travels smoothly and evenly within stator 32 when wheels 84 and 102 are engaged with carriage slots 34 of teeth 28. Connectors 56 and 174 are connected to cables 230 to transmit video and electrical signals to and from carriage 62 and computer and video system 22. Gear motor 86 drives wheels 84 and 102 to drive carriage 62 into and out of stator 32.

Lips 98 of housing top 96 engage slightly with wedge grooves 34 of teeth 28 which are opposite from those slots 34 which are engaged by wheels 84 and 102. This ensures proper positioning of indexer plate assembly 60 and, thus, proper alignment of carriage 62, by wheels 84 and 102, within wedge grooves 34. Proper alignment of carriage 62 by wheels 84 and 102 permits even and smooth traversement along slots 34. Wedge 90, which fits into slots 36, retains stator coils 30 and prevents them from vibrating.

Housing top 96 and housing bottom 94 of indexer plate assembly 60 retain carriage 62 prior to inspection. Top 96 is connected to bottom 94 with adjustable screws 92. This permits indexer plate assembly 60 to adjust to the width of a stator slot.

Figure 4:
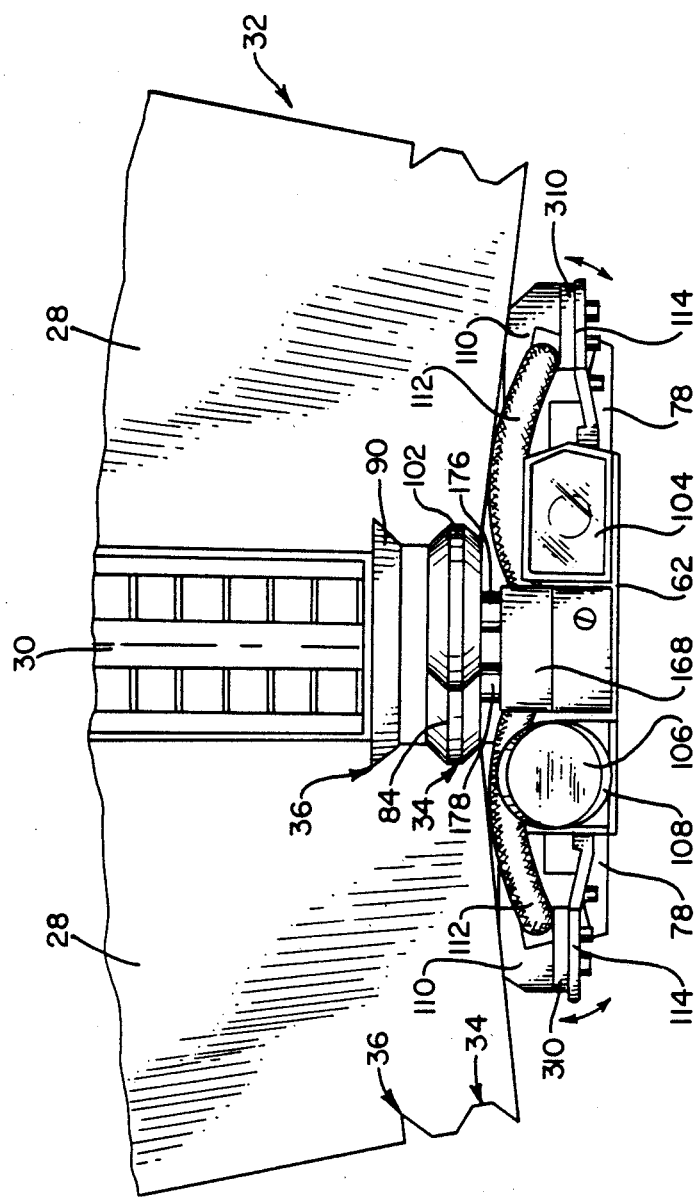
FIG. 4 is a partial front elevational view of the inspection system shown in FIG. 1 engaged with the stator of a generator.

FIG. 4 shows a front view of carriage 62 engaged with stator 32 and shows portions of LI assembly 143. The front end of carriage 62 contains video camera 194 and ferrite plugs 142, mounted in blocks 110. Camera 194 allows the operator to view the inside of stator 32 through lens 106. Mirror 108 permits the operator to scan the entire interior of stator 32. Lamp 104 provides lighting for visual analysis. Coils 112, held by clamp 168, are connected to ferrite plugs 142. This arrangement, known as "ELCID", as described above, permits laminated plates 26 to be tested for insulation breakdowns. Mountings 114 and leverments 78 control the placement of blocks 110 against plates 26 during testing. Movement of leverments 78 and mountings 114 are described below.

Figure 5:
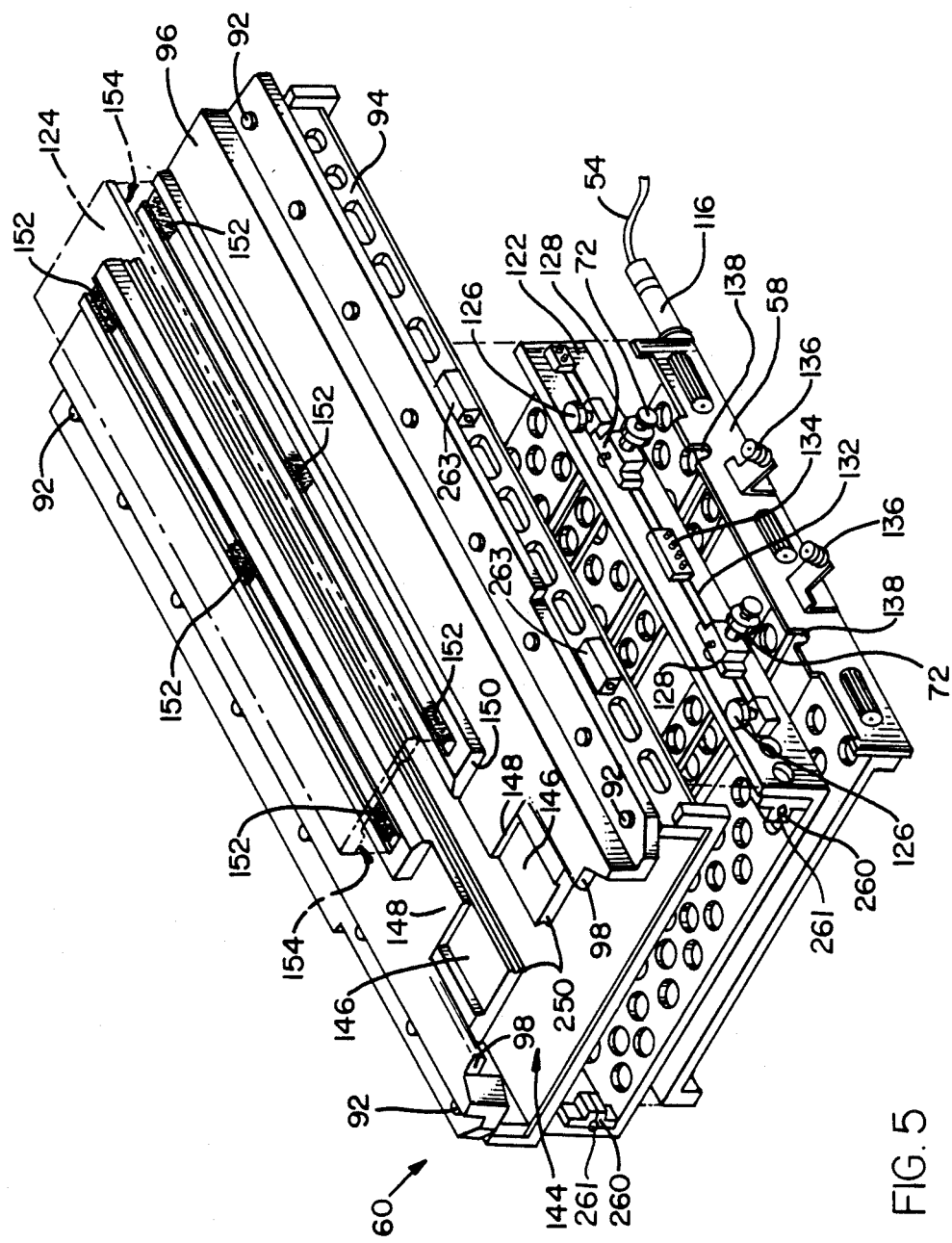
FIG. 5 is an exploded isometric view of the indexer and indexer plate assembly of the inspection system shown in FIG. 1.

FIG. 5 shows an exploded view of indexe plate assembly 60 and indexer 58. Indexer plate assembly 60 is constructed from base plate 122, housing bottom 94, housing top 96 and removable cover 124. Indexer 58 is sized and shaped to permit base plate 122 to fit within indexer 58. Fasteners 72 are so sized and shaped as to engage with U-shaped slots 138 of indexer 58. Mounts 128, which support fasteners 72, rest on plate springs 132. Springs 132 are then secured to plate 122 by fasteners 126 and 134. This arrangement permits proper adjustment of indexer plate assembly 60 within indexer 58.

Carriage 62 is so sized and shaped as to fit into opening 144, which is formed when top 96 is connected by fasteners 92 to bottom 94. Bottom 94 slides forward and backward on base plate 122 to further permit proper alignment of assembly 60 within stator 32. Linear bearings 263, which slide on shafts 261 secured to base plate 122 by shaft mountings 260, ensure smooth movement of bottom 94. Grooves 250 on top 96 engage wheels 84 and 102 of carriage 62 during pre-inspection preparations. Grooves 250 ensure proper alignment of carriage 62 within opening 144 and help to guide carriage 62 during initial engagement of slots 3 and wheels 84 and 102.

Cover 124 conceals most of grooves 250 when it is in place. Cover 124, when fastened to top 96 by attachments 152 and 154 (sold under the trademark "VELCRO"), adjusts the width of top 96 such that indexer plate assembly 60 can be used for inspection of variously sized generators. Cover 124 is so sized as to adjust the width of top 96 to the space between teeth 28 of stator 32. Indentations 146, sectors 148, flanges 150, and cover 124, when attached to top 96, slidingly engage with notches 270, 272, 274, and 276, respectively, when indexer plate assembly 60 is engaged with stator 32 during inspection set up.

As is known in the art, notches 270, 272, 274, and 276 are in an area of generator 20 known as the stator step iron region. This region is notched to prevent buildup of heat caused by magnetic flux generated internally, as is known in the art. Engagement of notches 270, 272, 274, and 276 by indentations 146, sectors 148, flanges 150, and properly installed cover 124, respectively, further ensure proper assembly 60 and, thus, carriage 62 engagement with stator 32.

Figure 6:
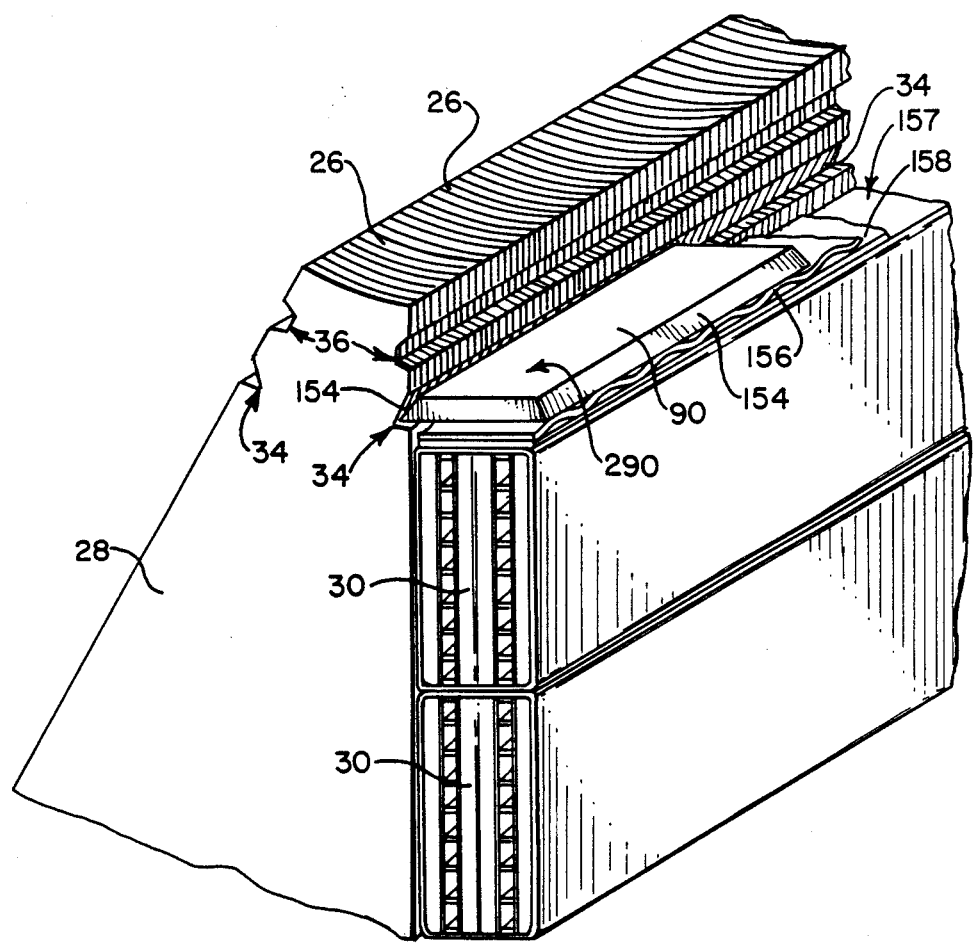
FIG. 6 is an isometric view of a stator tooth, stator coils, and a stator coil wedge.
Figure 7:
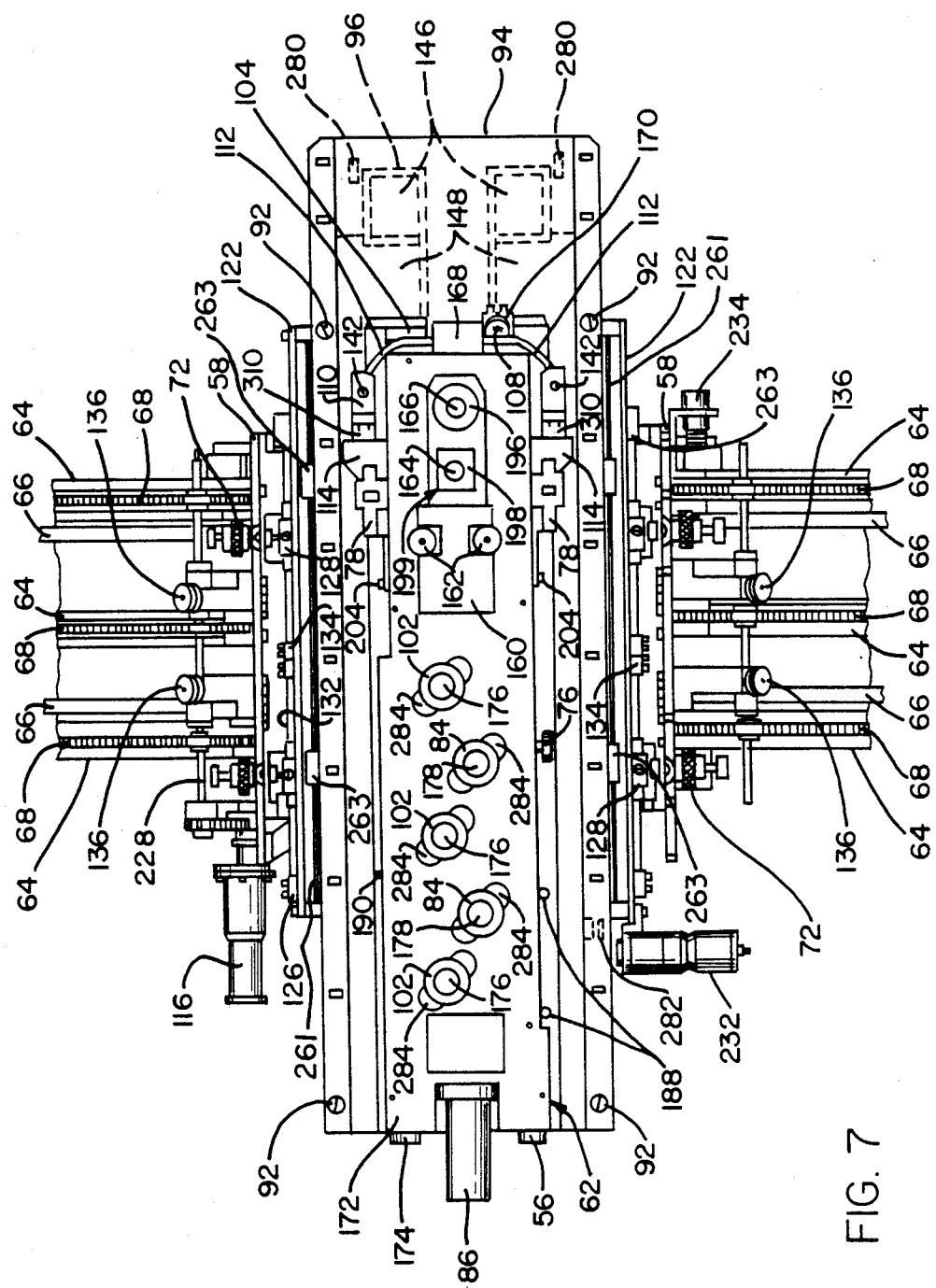
FIG. 7 is a partial plan view of a carriage, indexer, and indexer plate assembly of the inspection system shown in FIG. 1.
Figure 8:
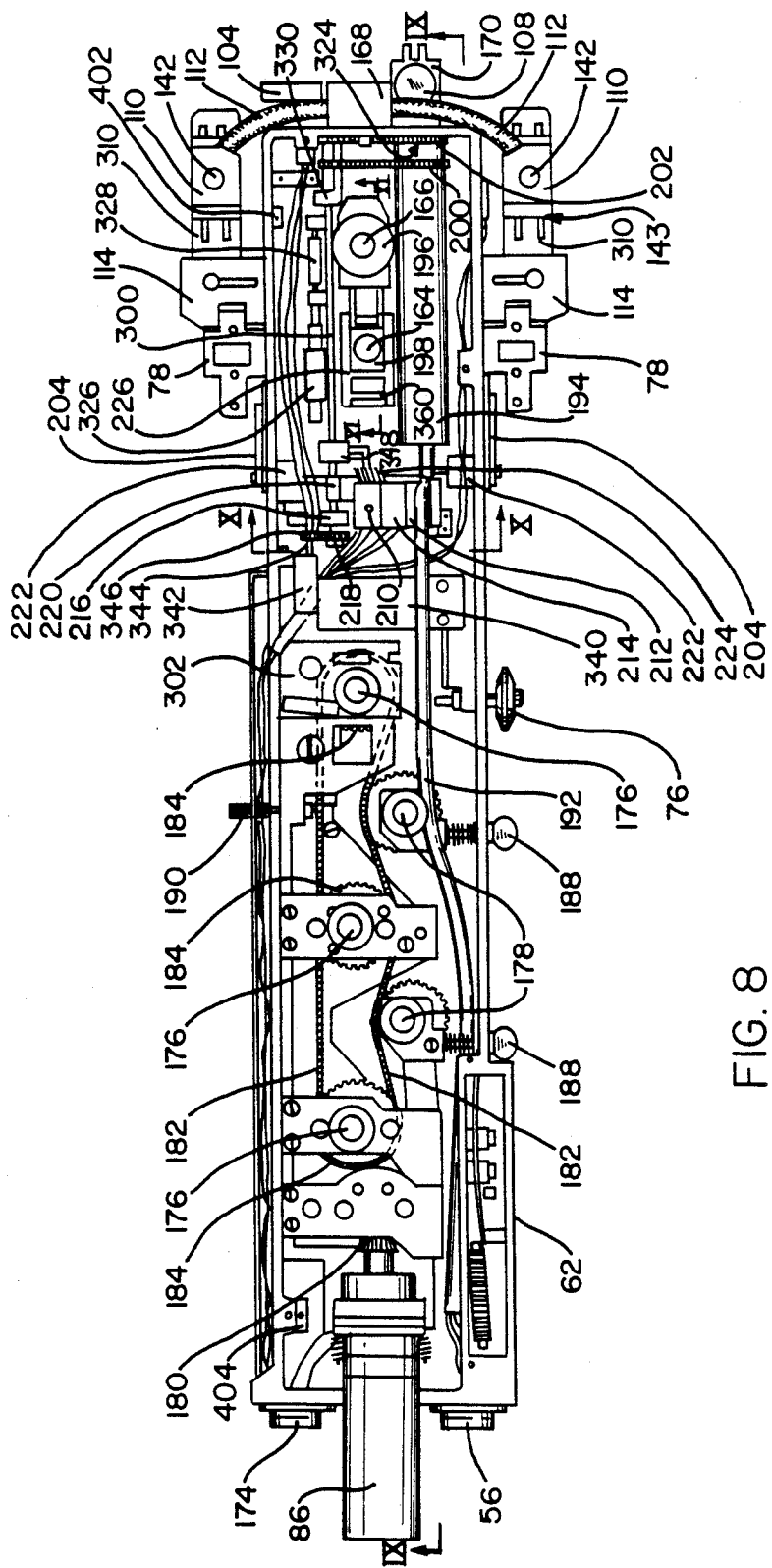
FIG. 8 is a plan view of the carriage of the inspection system shown in FIG. 1.

FIG. 6 shows a sectional view of a tooth 28 and the position of coils 30. Laminates 26, which make up tooth 28, are tested by LI assembly 143 of carriage 62 for insulation deterioration. Coils 30 are stacked in pairs, one on top of the other, in the stator slots between teeth 28. Backing plate 158, made of non-conducting material, is placed on face 157 of coil 30 closest to the interior of stator 32. Plate 158 provides a ridged surface between face 157 and wave spring 156. Wedge 90 is then used to secure coils 30 within stator 32. Edges 154 of wedge 90 are shaped to fit wedge grooves 34 so that wedge 90 is snugly fit into wedge grooves 34. The springs 156 sometimes lose some of their resiliency during the life of the generator, and, thus, the wedges become loose. The WT assembly inspects for such a condition FIG. 7 shows a top view of carriage 62 placed within assembly 60. Assembly 60 is resting in indexer 58, which rides on chains 68. Axial motor 232 controls the motion of assembly 60 within stator 32. Encoder 234 transmits the relative circumferential position of indexer 58 to the operator. Infrared switch 280 and limit switch 282 relay back to the operator the relative position of indexer plate assembly 60. Infrared switch 280 is actuated when indexer plate 60 reaches its EXTEND position, in which it is registered with a slot. Limit switch 282 is actuated when indexer plate 60 assumes its HOME position, in which it is located within indexer 58. Once switch 280 detects proper registration and alignment of assembly 60 within stator 32, motor 232 is disabled, preventing further movement of assembly 60 until inspection of the stator slot is complete and the carriage is in its HOME position.

Lid 172 covers the top of carriage 62. Openings 284 allow shafts 176 and 178, on which wheels 102 and 84, respectively, rotate, to rotate freely when adjusters 188 and 190 are used to adjust relative placements of shafts 176 and 178. Adjusters 188 and 190 increase or decrease the tension on shafts 176 and 178. This causes the alignment of wheels 84 and 102 to change such that carriage 62 can travel down any sized slot formed between teeth 28. Guide wheels 162, which are spring mounted in mount 160, ensure proper engagement of the front end of carriage 62 with wedge grooves 34 of teeth 28.

WT assembly 199 includes microphone, or acoustic sensor, 198 and solenoid 196, which perform the WT inspection as described above. Ejector 166 of solenoid 196 impacts a face 290 of wedge 90. Cup 164 of microphone 198 is placed against face 290 and permits microphone 198 to pick up the resulting sound of the impact caused by ejector 166.

FIGS. 8 through 11 show views of carriage 62. Motor 86 drives pinion gear 180, which is engaged with bevel gear 206. Gear 206 causes shaft 193 to rotate chain 191 (on sprockets not shown). Shaft 176, rotated by chain 191, further rotates chain 182. Chain 182 is looped over sprockets 184 and 186, which rotate shafts 176 and 178. When shafts 176 and 178 rotate, wheels 102 and 84, respectively, also rotate. Motor 86 can turn pinion gear 180 clockwise or counterclockwise which permits carriage 62 to move in either direction within a stator slot. Adjusters 188 adjust the lateral movement of shafts 178, and, consequently, wheels 84. This permits wheels 84 and 102 to engage slots 36 of teeth 28 regardless of the space between teeth 28. Tension on chain 182 is controlled by adjuster 190, which is connected to sprocket mount 302. Shaft 176 and sprocket 184 closest to camera 194 are mounted in mount 302. As adjuster 190 is turned, mount 302 will move toward or away from motor 86. Setting adjusters 188 will dictate how adjuster 190 should be turned to maintain proper tension on chain 182.

Infrared switch 402 sends a signal to the computer indicating that carriage 62 has reached the end of a stator slot. Accordingly, carriage 62 will not fall out of a slot 34 if it is driven too far. Infrared switch 404 sends a signal to computer 52 indicating that carriage 62 has reached its HOME position and is within indexer plate assembly 60, Encoder wheel 76 transmits back to the operator the relative position of carriage 62 when it is inside stator 32 through encoder 340 This permits the operator to know the exact location of any loose wedges 90 or deteriorated insulation on plates 26 so proper action can be taken. Mirror rotate encoder 406 relates back the position of mirror 108 as it is rotated by timing belt 324. This allows the operator to know the exact section of generator 20 being visually inspected by camera 194.

Motors 210, 212, and 214 operate, respectively, WT assembly 199, LI assembly 143, and mirror 108 tilt. Motor 210 moves WT assembly 199 between an EXTEND position, in which it can impact a wedge, and a RETRACT position, in which carriage 62 can be moved. Motor 212 moves LI assembly 143 between an EXTEND position, in which an LI inspection can be performed, and a RETRACT position. Motor 214 tilts mirror 108 about an axis that is perpendicular to the longitudinal axis of camera 194 and that lies in the plane of FIG. 8. Motor 210, when activated, causes wedge tightness frame 226 to lift from its passive RETRACT position within carriage 62 to its active EXTEND position, about pivot 360, whereby cup 164 of microphone 198 is placed near face 290 of wedge 90.

Computer 52 causes ejector 166 of solenoid to impact against face 290 of wedge 90. The resulting noise from the impact is sensed by microphone 198 and is transmitted back to the computer through cable junction 174 and cable 230. The translation of motor 210 rotational movement to linear movement of frame 226 is accomplished by a similar arrangement (but not shown for clarity reasons) of cables 220, springs 224, and pulleys 222, as shown in FIG. 11, which is shown for motor 212. Motor 212, when activated, causes LI assembly 143 to be raised. Rotational motion of motor 212 is translated, by the cables 220, pulleys 222, and springs 224 systems shown in FIG. 11, to linear movement which causes levers 204 to rise and fall.

Movement of levers 204 controls plates 78 and 114, which, in turn, raise and lower support brackets 310. As support brackets 310 are raised and lowered, ferrite plugs 142 come into contact with plates 26 of teeth 28 to check for insulation deterioration. Motor 214, when activated, causes mirror 108 to tilt, enabling the operator to view airgap 80 of stator 32. A cable 220 and pulleys 222 system (not shown for clarity) causes pulley 324 to take up or let out cable 208, which is connected to mirror assembly 170, causing mirror 108 to tilt up or down. Spring 167 ensures that mirror 108 returns to its proper tilt position after airgap 80 is inspected.

Motor 326 controls the rotation of mirror assembly 170 about the longitudinal axis of camera 194. Motor 326 causes shafts 328 and 330 to rotate, causing chain 202 to rotate around sprocket 324 of mirror assembly 170. An encoder 406 provides information pertaining to the relative rotational position of mirror 108. Motor 342 controls the focus mechanism of camera 194. As shaft 344 is rotated by motor 342, gear 346 engages and rotates gear 218. Shaft 300, resting on supports 348 and 330, rotates as gear 218 rotates, causing timing belt 200 to move the lens in camera 194.

Figure 12:
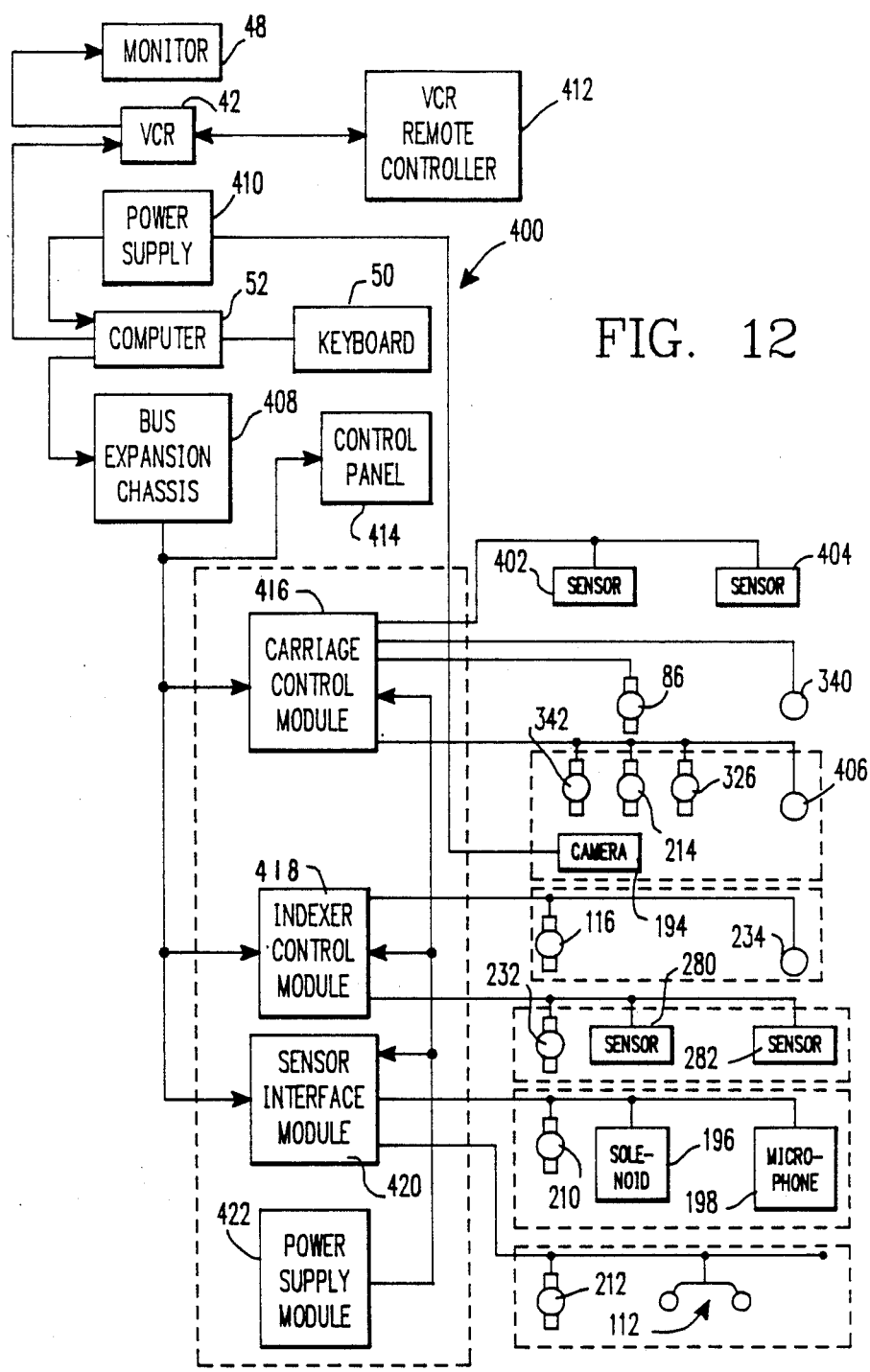
FIG. 12 is a block diagram of the electronic system for the inspection system shown in FIG. 1.

FIGS. 12 through 21 show schematically the details of the electrical control system for the generator inspection assembly. FIG. 12 shows a block diagram of system 400. System 400 includes a microprocessor, or computer, 52, which can be accessed through an ASCII keyboard located on operator keyboard 50. Microprocessor 52 coordinates the operation of system 400 and controls the acquisition, storage and dissemination of information developed by system 400.

A conventional bus expansion chassis 408 is provided to permit microprocessor 52 to communicate with the control modules of system 400. Camera 194 is a conventional, commercially available camera which supplies a composite video signal to microprocessor 52 via its camera power supply 410. Depending on the mode of operation, microprocessor 52 either can pass the composite video signal directly to VCR 42, which is preferably of VHS formate for real-time display or it can digitize one or more frames of video and save them for later display through VCR 42. VCR 42 displays video supplied to it from microprocessor 52 on color monitor 48. Conventional VCR remote controller 412 permits remote operation of VCR 42.

Keyboard 50, which is part of operator control panel 414, includes the switches and indicator lights necessary to permit the system operator to perform a generator inspection. Generally, operator control panel 414 includes:

(1) Switches that permit the operator to rotate and tilt mirror 108;

(2) A control that permits adjusting the intensity of the carriage lighting system;

(3) A pair of switches that permits the operator to jog the carriage or indexer;

(4) A switch that permits the operator to adjust the focus of the camera;

(5) Indicator lights that are energized when the limits of camera focus, mirror rotation and mirror tilt have been reached;

(6) Indicator lights that are energized when mirror encoder 403 is producing pulses (7) Switches that permit the operator to stop the carriage or the indexer in a controlled or uncontrolled fashion;

(8) An indicator light that is energized when the carriage or indexer emergency stop switch has been actuated and the indexer or carriage is being brought to an uncontrolled stop;

(9) An indicator lamp that is energized when power is available from the system console;

(10) An indicator lamp that is energized when that the console is receiving power from a suitable source;

(11) An operator screen that provides and requests information pertaining to system operation.

System 400 also includes four control modules. Carriage control module 416 controls the operation of carriage main drive motor 86, camera focus motor 342, mirror tilt motor 214, and mirror rotate motor 326. Carriage control module 416 receives information from front and back carriage sensors 402 and 404, carriage main drive motor position encoder 340, and mirror rotate motor encoder 406. Front sensor 402 is actuated when carriage 62 reaches its limit of travel at the end of a stator slot. Back sensor 404 is actuated when carriage 62 reaches its HOME position Indexer control module 418 controls the operation of indexer main drive motor 116 and indexe plate motor 232. Indexer control module 418 receives information from indexer main drive motor position encoder 234 and indexer plate EXTEND and HOME sensors 280 and 282. EXTEND sensor 280 is actuated when indexer plate 60 is in registration with a stator slot. HOME sensor 282 is actuated when plate 60 is in its HOME position within indexer 58. Sensor interface module 420 controls the operation of wedge tightness drive motor 210, lamination inspection drive motor 212, and LI coils 112.

Module 420 also receives information pertaining to lamination integrity from coils 112. Power supply module 422 provides a 28 volt supply for motors 86, 116, 232, 210, and 212, plus a 5 volt supply for the logic circuitry of modules 416, 418, and 420, plus and minus 15 volt supply for the analog circuit of modules 416, 418, and 420, and plus 7.5 volt supply for focus motor 342, mirror tilt motor 214, and mirror rotate motor 326.

Carriage control module 416 controls operation of carriage main drive motor 86. Carriage control module 416 employs a pulse width modulator to drive carriage motor 86. Module 416 further includes fault detection logic that detects motor 86 lead faults. Module 416 also includes current limiting circuitry that limits the maximum current flowing through motor 86. Module 416 controls energization of eight status indicator lamps that indicate:

(1) the direction of rotation of motor 86;
(2) that motor 86 is not rotating;
(3) the existence of a problem executing the current command;
(4) that front carriage sensor 402 has indicated that the front limit for the carriage has been violated;
(5) that back carriage sensor 404 is indicating that carriage 62 has reached its HOME position;

(6) that encoder 340 channel A is sending pulses to module 416;

(7) that encoder 340 channel B is sending pulses to module 416;

(8) the existence of a fault on a lead of motor 86.

Module 416 communicates with a reset switch, which is located on the module front panel of module 416 that permits the operator to reset module 416 and restart motor 86 after a fault has occurred.

Module 416 also controls the tilt and rotation of camera mirror 108 and the focus of camera 194. Module 416 communicates with a current meter located on panel 414 that displays the current flowing through any one of motors 342, 214, and 326 chosen by the operator. Module 416 also determines when mirror 108 has been rotated to one of its mechanical limits and, at that point, shuts down the voltage and current to mirror rotate motor 326. Module 416 detects faults on the leads of motors 342, 214, and 326 and provides current limiting for those motors. Module 416 also communicates with a reset switch which permit motors 342, 214, or 326 to be restarted after a fault has occurred.

Figure 13:
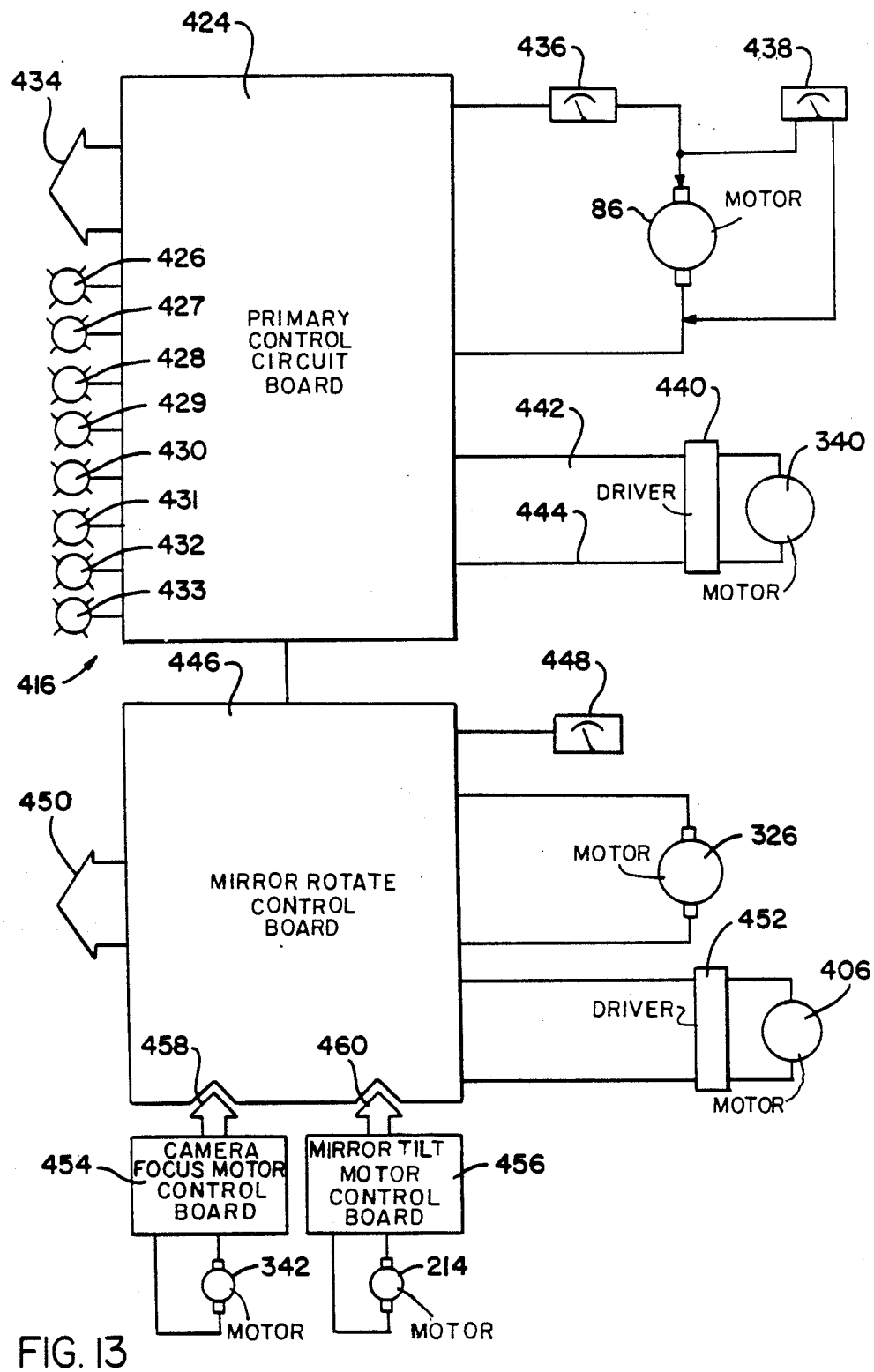
FIG. 13 is a schematic diagram of the carriage control module of the system shown in FIG. 12.

FIG. 13 shows in schematic form carriage control module 416. Module 416 includes the primary control circuit board 424. Board 424 controls the energization of the eight status indicator lamps 426 through 433 identified above. Board 424 also includes rack compatible connector 434 that permits board 424 to be plugged into the rack of computer 52 and to provide electrical communication therebetween. Module 416 communicates with a current meter 436, which senses the current flowing through motor 86, and a volt meter 438 which senses the voltage across motor 86. Both meters 436 and 438 are located on the front panel of module 416.

Carriage main drive motor position encoder 340 provides position signals to board 424 via differential line driver 440. Differential line driver 440 produces a pair of position signals on lines 442 and 444. Line 442 carries the channel A signal produced by encoder 340 and the inverted channel A signal. Line 444 carries the channel B signal produced by encoder 340 and the inverted channel B signal. The channel A and channel B signals produced by encoder 340 are electrically separated by 90 degrees. Board 424 includes encoder logic that receives and processes the information it receives from driver 440. Board 424 energizes indicator lights located on panel 414 when sensors 402 or 404 indicate that a carriage travel limit has been reached. Board 424 generates a signal that disables motor 86 and energizes an indicator lam on panel 414 when a limit has been reached.

Module 416 also includes mirror rotate control board 446. Board 446 controls the operation of mirror rotate motor 326. Board 446 communicates with a current meter 448, which is located on operator control panel 414 and displays motor 326 current. Board 446 includes rack compatible connector 450 to permit board 446 to be plugged into the rack of computer 52 and provide electrical communication therebetween. Encoder 406 communicates with board 446 through differential line driver 452, which is identical to differential line driver 440 described above.

Module 416 also includes camera focus motor control board 454 and mirror tilt motor control board 456. Board 454 controls the operation of camera focus motor 342, and board 456 controls operation of mirror tilt motor 214. Board 454 includes connector 458 which plugs into a mating connector located on board 446.

Board 456 includes connector 460 which plugs into a mating connector located on board 446. Connectors 458 and 460 permit electrical communication between board 446 and each of boards 454 and 456.

Each of boards 446, 454, and 456 includes a motor amplifier, fault detection logic, and reset circuit. Each of boards 454 and 456 is identical to board 446, with the exception that they have no logic to interface with a position encoder or differential driver. Mirror rotate control board 446 includes logic that receives signals from driver 452 when encoder 406 is producing pulses. Board 446 provides a signal that energizes an indicator lamp on control panel 414 when a clockwise or counterclockwise limit of mirror rotation has been reached. Board 446 also disables the mirror rotate motor 326 when a rotation limit has been reached to prevent the limit from being exceeded. Board 446 also energizes an indicator light on panel 414 when it disables motor 326. Current meter 448 provides an indication of the motor supply current for the motor 326, 342, or 214, that is currently operating. Boards 424, 446, 454, and 456 further provide appropriate amplification to operate motors 86, 326, 342, and 214.

Indexer control module 418 controls the operation of indexer main drive motor 116 and indexer plate motor 232. Module 418 includes primary motor control board 462 and indexer plate control board 464. Primary motor control board 462 controls the operation of indexer main drive motor 116. Board 462 provides signals to energize indicator lamps 466 and 468 located the front panel of module 418. Indicator lamp 466 is energized when channel A of encoder 234 is producing pulses and indicator lamp 468 is energized when channel B of encoder 234 is producing pulses.

Board 462 includes a rack compatible connector 470 that can be plugged into the rack on computer 52 to provide electrical communication therebetween. Board 462 communicates with current meter 472, which is located on the front panel of module 418 and indicates the level of motor current supplied to motor 116. Board 462 also communicates with volt meter 474, which is located on the front panel of module 418 and indicates the level of voltage across the leads of motor 116. Encoder 234 electrically communicates with differential line driver 476, which is identical to differential line driver 440. Board 462 communicates with a reset switch located on the front panel of module 418 that permits restarting of motor 116 after occurrence of a motor fault. Control board 462 is identical to board 424.

Indexer plate control board 464 electrically communicates with indicator lamps 478 and 480. Indicator lamp 478 is energized when the indexer plate is being moved at its fast speed. Indicator lamp 480 is energized when the indexer plate is being moved at its slow speed. Board 464 communicates with a reset switch located on the front panel of module 418 that permits the operator to restart motor 232 after a fault condition has occurred.

Board 464 includes a rack compatible connector 484 that can be plugged into computer 52 to provide electrical communication therebetween. A current meter 486 is located on control panel 414 and indicates the level of the current flowing into motor 232. Board 464 communicates with mechanical limit switch 282, which closes when indexer plate 60 has reached its HOME position. Board 464 also communicates with sensor 280, which closes when indexer plate 60 has reached its EXTENDED position. Motor 232 is disabled when either of sensors 282 or 280 is activated. Board 464 includes an open loop pulse width modulator control circuit to control operation of motor 232.

Sensor control module 420 controls operation of lamination integrity lift motor 212, wedge tightness lift motor 210, impact solenoid 196, and acoustic sensor 198. Sensor control module 420 includes a sensor interface board 488.

Board 488 communicates with eight indicator lamps 490 through 497. Indicator lamp 490 is energized when WT assembly 199 is in its RETRACT position. Indicator lamp 491 is energized when computer 52 releases wedge tightness impactor 166. Indicator lamp 493 is energized when a wedge tightness inspection is being executed, that is, when wedge tightness impact 166 is commanded to impact a wedge several times and acoustic data from the impacts is being gathered Indicator lamp 493 is energized when LI assembly 143 is in its retracted position Indicator lamp 494 is energized when LI coils 112 produce an electrical signal that exceeds upper or lower limits Indicator lamp 495 is energized when computer 52 is executing an LI inspection. Indicator 496 is energized when a fault condition exits on motor 212. Indicator 497 is energized when a fault condition exists on motor 210.

Figure 15:
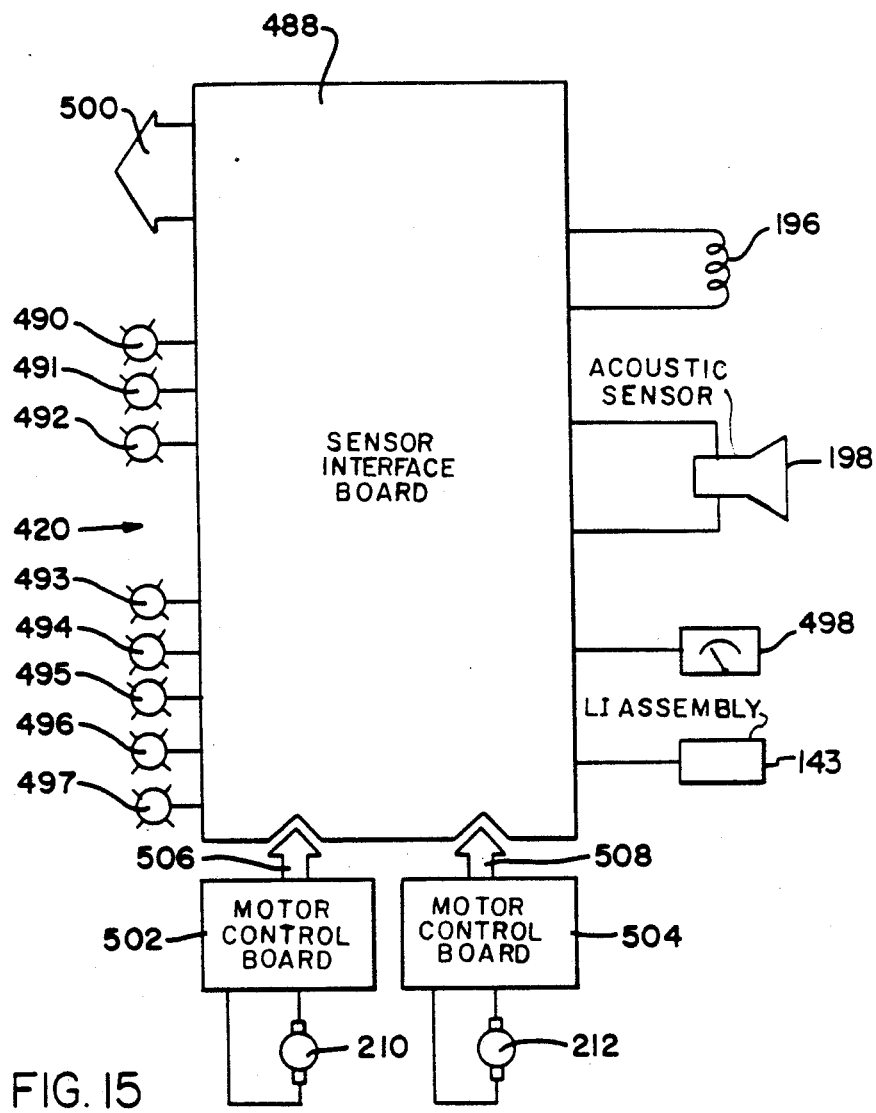
FIG. 15 is a schematic diagram of the sensor interface module of the system shown in FIG. 12.

As shown in FIG. 15, board 488 communicates with WT solenoid 196 and WT acoustic sensor 198. Board 488 receives commands from computer 52 and produces signals to activate solenoid 196 Board 488 also includes an acoustic signal conditioning circuit that receives acoustic signals from sensor 198. Board 488 also communicates with a current meter 498, which indicates the level of current being supplied to the lamination integrity lift motor 210 or wedge tightness lift motor 212 that is energized.

Board 488 also includes rack compatible connector 500 which can be plugged into the rack of computer 52 to provide electrical communication therebetween. Module 420 also includes motor control boards 502 and 504. Motor control board 502 controls the operation of lamination integrity lift motor 212. Motor control board 504 controls the operation of wedge tightness lift motor 210.

Board 502 includes connector 506 that can be plugged into a mating connector located on board 488 to provide electrical communication therebetween Board 504 includes connector 508 that can be plugged into a mating connector located on board 488 to provide electrical communication there between Only one of motors 210 and 212 can be operated at any one time, and current meter 498 indicates the level of current supplied to the motor 210 or 212 that is operating. Boards 502 and 504 are identical to boards 454 and 456.

Board 488 controls the operation of impact solenoid 196 and conditions and amplifies the signal produced by acoustic sensor 198. Board 488 filters noise from the signal produced by sensor 198 and provides an indication, via lamp 494, when upper or lower limits for sensor 198 signal have been exceeded.

Sensor 198 produces a distorted sine wave. Board 488 determines the times between peaks in the distorted signal produced by sensor 198. As is known in the art, the tighter the stator coil wedge, the smaller the difference in time between peaks in the signal produced by sensor 198. Board 488 also communicates with a reset switch, located on the front panel of module 420, that can be used by the operator to restart a motor 210 or 212 after a fault condition has occurred.

Computer 52 controls the wedge tightness inspection process. Computer 52 initiates the wedge tightness inspection process by activating impact solenoid 196 and starting a timing circuit. Impact solenoid 196 causes impactor 166 to hit a wedge and the resulting acoustic information is collected by acoustic sensor 198. Acoustic sensor 198 produces an electrical signal corresponding to the acoustic data it receives and provides the electrical signal to board 488 for conditioning. If board 488 receives an acoustic signal from sensor 198, a normal procedure has occurred, and the timing circuit is reset. However, if either impactor 166 did not hit a wedge or if sensor 198 d not produce an acoustic signal that turns off the command that released impactor 166, the timing circuit times out and computer 52 recognizes an abnormal or error condition.

Figure 14:
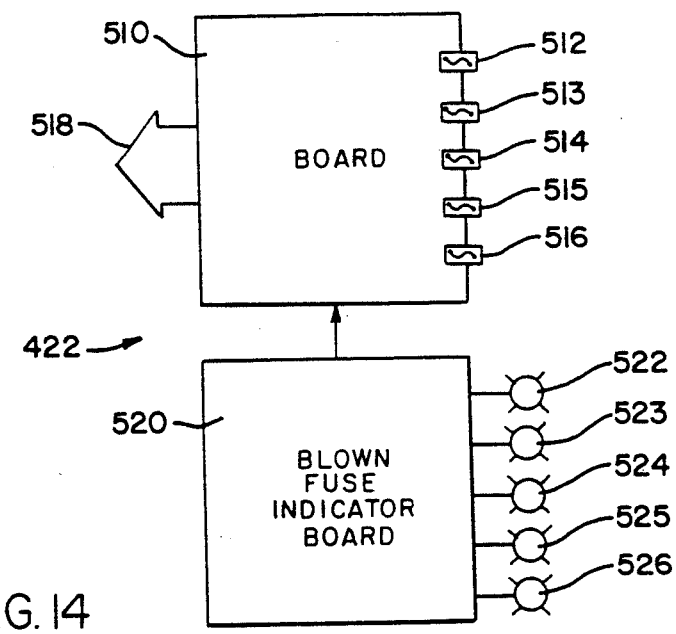
FIG. 14 is a schematic diagram of the power supply module of the system shown in FIG. 12.
Figure 20:
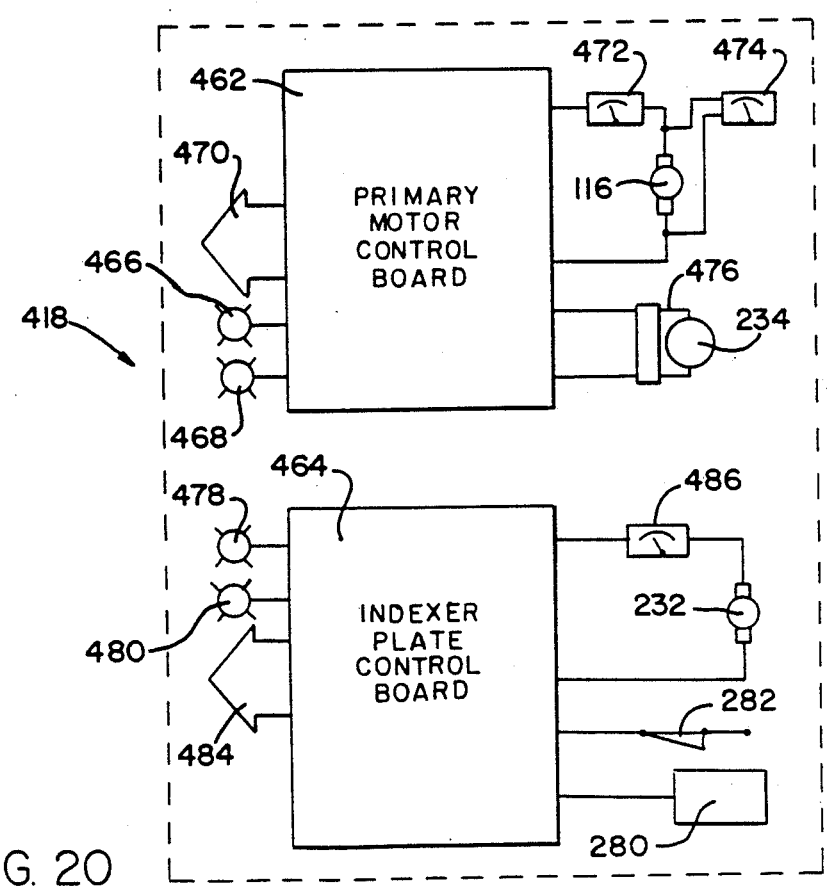
FIG. 20 is a schematic diagram of the indexer control module of the system shown in FIG. 12.
Figure 16:
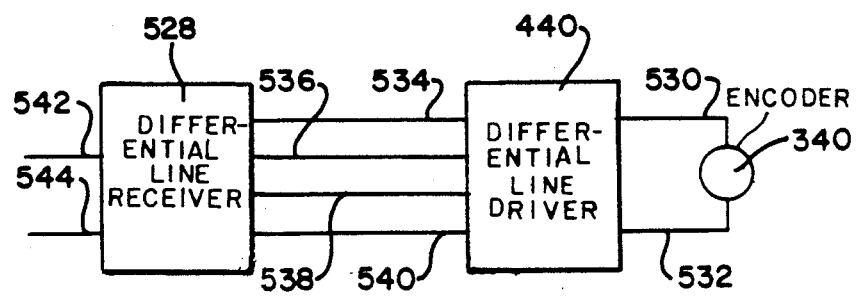
FIG. 16 is a schematic diagram of the differential line drivers and receivers employed by the system shown in FIG. 12.

Power supply module 422 is shown in FIG. 14. Module 422 includes multi-output power supply 410, which provides the $+28$, $+5$, $+15$, $-15$, and $+7.5$ volt identified above. Board 410 communicates with fuses 412 through 416, located on panel 414, which correspond to each voltage level supplied by board 410. Board 510 also includes rack compatible connector 518, which can be plugged into the rack located on computer 52 to provide electrical communication therebetween. Module 422 also includes blown fuse indicator board 520. Board 520 communicates with five indicator lamps, 522 through 526, located on panel 414. Each of lamps 522 through 526 corresponds to a fuse 512 through 516 and is energized when that fuse blows FIG. 16 shows differential line driver 440, encoder 340, and differential line receiver 528. Each of boards 424, 446, and 462 includes differential line receivers that are identical to those shown in FIG. 16. As was described generally above, encoder 340 produces two square waves A first square wave, produced by channel A, is generated on line 530. A square wave that is 90 electrical degrees out of phase with channel A is produced by channel B of encoder 340 on line 532.

Differential line driver 440 produces the channel A signal on line 534, the inverted channel A signal on line 536, the channel B signal on line 538, and the inverted channel B signal on line 540. Differential line receiver 528 produces the channel A signal on line 542 and the channel B signal on line 544. Differential line driver 440 and differential line receiver 528 eliminate common mode noise occurring between channels A and B, which is injected during transmission of the channel A and channel B signals during transmission from encoder 340 to board 424.

Differential line driver 440 and differential line receiver 528 also produce signals on lines 542 and 544 which permit computer 52 to determine the direction of rotation of motor 86. The operation and construction of encoder 340, differential line driver 440, and differential line receiver 528 are all conventional and well known to those of ordinary skill in the art.

Figure 17:
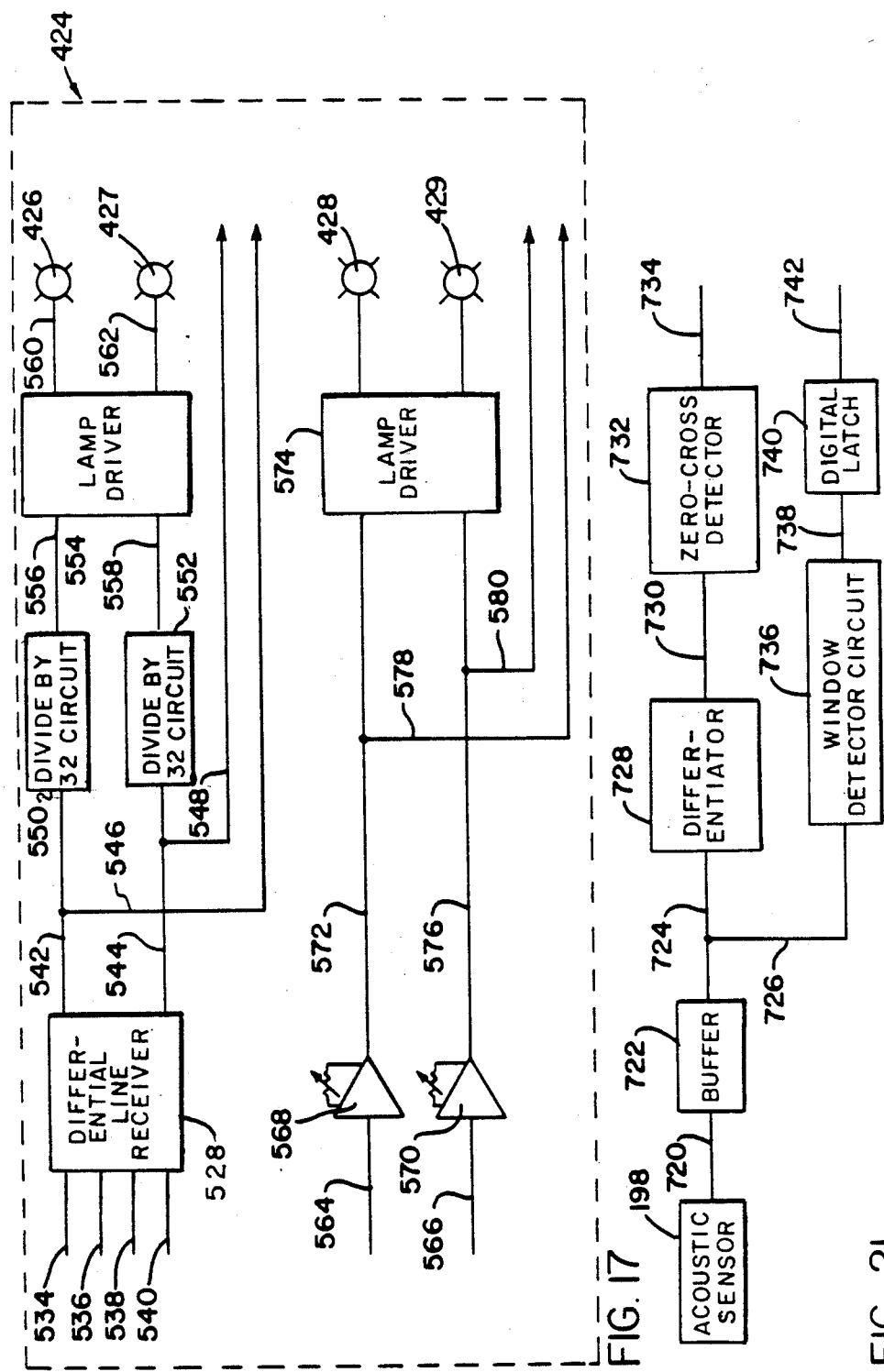
FIG. 17 is a schematic diagram of a portion of the primary motor control circuit of the module shown in FIG. 13.
Figure 18:
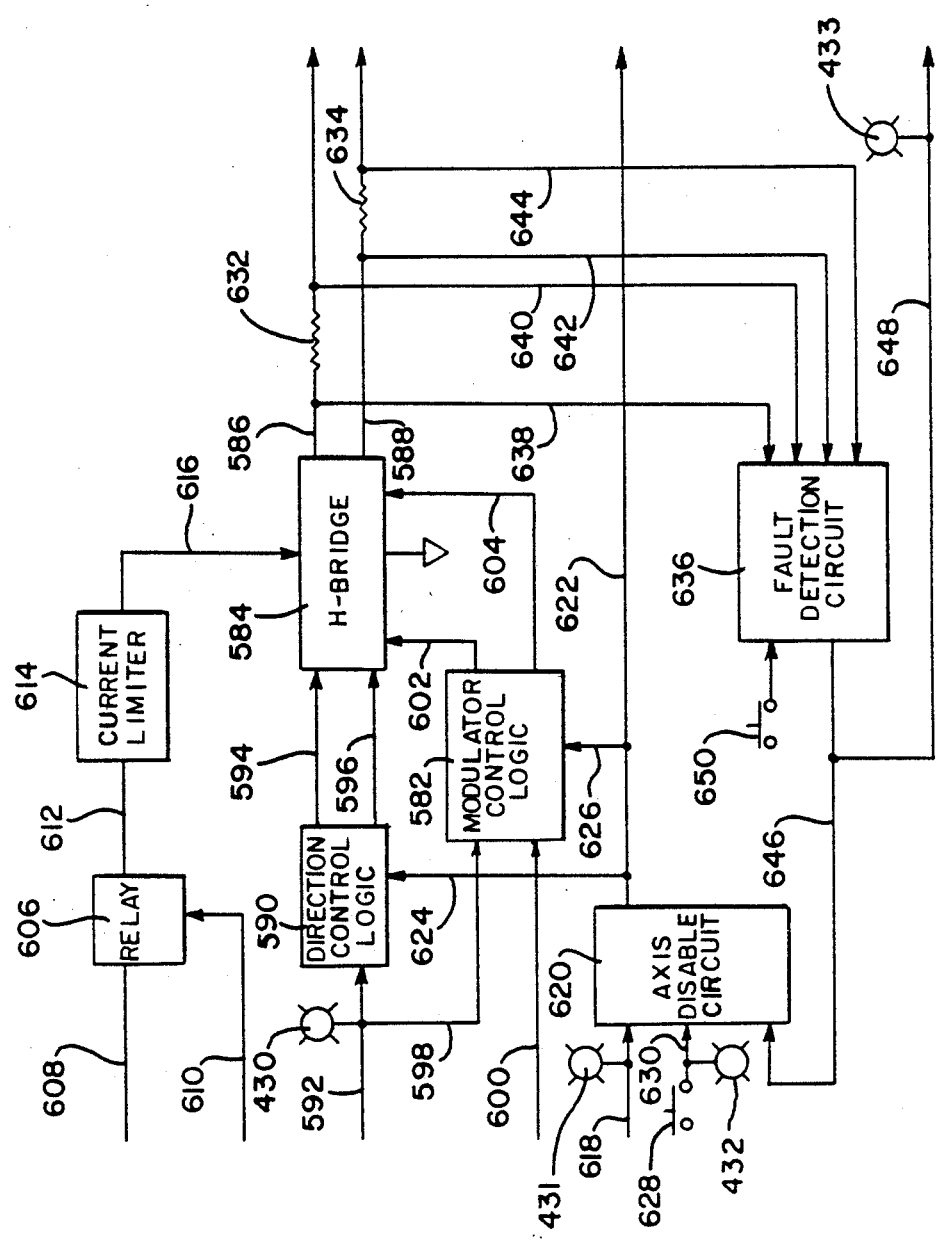
FIG. 18 is a schematic diagram of a portion of the primary motor control circuit shown in FIG. 13.

FIGS. 17 and 18 show in block diagram form the circuit contained on primary motor control board 424. Circuits that perform the functions of the blocks shown in FIGS. 17 and 18 are well known and commercially available.

FIG. 17 shows indicator lamps 426 and 427. Lamp 426 flashes when encoder 340 is producing pulses on channel A. Lamp 427 flashes when encoder 340 is producing pulses on channel B. Differential line receiver 528 receives the channel A signal on line 534, the inverted channel A signal on line 536, the channel B signal on line 538, and the inverted channel B signal on line 540.

As described above, differential line receiver 528 produces the channel A signal on lines 542 and 546 and the channel B signal on lines 544 and 548. A pair of divide-by-32 circuits 550 and 552 receive the channel A and channel B signals, respectively, and reduce the frequency of the channel A and B signals to a level at which they cause lamps 426 and 427 to flash at a visually perceptible rate.

Lamp driver 554 receives the signals produced by the circuits 550 and 552 on lines 556 and 558, respectively, and boosts those signals to a level sufficient to energize lamps 426 and 427. The output of driver 554 is provided to lamps 426 and 427 along lines 560 and 562, respectively. Computer 52 receives the channel A and channel B signals along lines 546 and 548, respectively. Computer 52 uses those signals to determine the position of carriage 62.

Module 424 receives signals from carriage sensors 402 and 404 along lines 564 and 566, respectively. Amplifiers 568 and 570 have adjustable sensitivities to compensate for varying distances between sensors 402 and 404, and the interior of stator 32 to ensure that amplifiers 568 and 570 produce signals of a consistent level. Indicator lamp 428 is energized when the carriage travels too far through stator 32 and attempts to exit stator 32, thus exceeding a limit of travel.

Indicator lamp 429 is energized when carriage 62 reaches its HOME position. When carriage 62 has traveled too far through stator 32 and is about to exit stator 32, sensor 404 produces a signal on line 564 that is amplified by amplifier 568. The amplified signal is produced on line 572 and provided to lamp driver 574. Similarly, sensor 402 produces a signal on line 566 when carriage 62 reaches its HOME position, which signal is amplified by amplifier 570 and provided to driver 574 on line 576. Lamp driver 574 boosts the signals on lines 572 and 576 to a level that is sufficient to drive indicator lamps 428 and 429.

The outputs of amplifiers 568 and 570 are also produced on lines 578 and 580, respectively. The signals on lines 578 and 580 are provided to computer 52 to permit it to determine when carriage 62 has reached either limit of its travel.

FIG. 18 shows the portion of board 424 that controls the operation of motor 86, limits the current into motor 86 and detects faults on motor 86. Pulse-width modulator control logic 582 drives motor 86 through FET H-bridge 584. Driving current is supplied to motor 86 along lines 586 and 588. Both pulse width modulator control logic 582 and H-bridge 584 are well known to those of ordinary skill in the art.

H-bridge 584 allows bi-directional motor rotation and control using a single-ended power supply. Direction control logic 590 receives a direction signal from computer 52 along line 592. Direction control 590 produces direction signals on lines 594 and 596 that determine the direction in which motor 86 rotates. Indicator lamp 430 receives a direction signal from line 592 and indicates the direction in which motor 86 is rotating The direction signal is also provided to pulse width modulator control logic 582 along line 598. Pulse width modulator control logic 582 receives pulse width modulated signals from computer 52 along line 600. Pulse width modulator control logic 582 provides control for pulse width modulated signals for each half of H-bridge 584 along lines 602 and 604.

Emergency stop relay 606 receives 28 volts DC from power supply module 422 along line 608. Relay 606 receives a signal along line 610 when the emergency stop switch on operator control panel 414 has been actuated by the operator The emergency stop actuator switch is thrown by the operator when the operator wishes to immediately stop carriage travel. When relay 606 receives the emergency stop signal on line 610, relay 606 turns off current flowing in signal 612 which, in turn, causes H-bridge 584 to shut down motor 86. When an emergency stop signal is not present on line 610, current limiter 614 permits the H-bridge 584 to operate motor 86 normally, unless the maximum current level is exceeded.

Computer 52 produces a signal on line 618 that commands board 424 to disable motor 86 when carriage 62 reaches a limit of its travel. When a carriage disable signal is produced on line 618, axis disable circuit 620 produces signals on lines 622, 624, and 626 that cause direction control circuit 590, pulse width modulator control logic circuit 582, and H-bridge 584 to disable motor 86. A signal on line 622 is provided to computer 52 to inform computer 52 that motor 86 is inoperable. When computer 52 produces a command on line 618 to disable motor 86, indicator light 431 is energized.

A manual disable switch 628 is provided on board 424 to permit the operator to manually disable carriage motor 86. When the operator closes switch 628, the signal on line 630 causes axis disable circuit 620 to produce a signal on line 622 that causes direction control circuit 590, pulse width modulator control logic 582, and H-bridge 584 to disable motor 86 and to inform computer 52 that motor 86 has been disabled. Closing switch 628 also causes indicator 432 to be energized, indicating that a manual disable has been effected.

Resistors 632 and 634 are connected in lines 586 and 588, respectively, to permit fault detection monitoring of motor 86 leads. Fault detection circuit 636 receives the voltage across resistors 632 and 634 via leads 638, 640, 642, and 644. Circuit 636 thus can determine whether the current entering motor 86 is at the same level as the current leaving motor 86 by detecting the voltage across resistors 632 and 634.

If the currents entering and exiting motor 86 are not equal to each other, circuit 636 assumes that a fault condition exists, and it instructs axis disable circuit 620 to shut down motor 86 by generating an appropriate signal along line 646 The fault indication signal on line 646 is also provided to computer 52 along line 648 to inform computer 52 that a fault condition exists and also energizes fault indicator lamp 433, which is located on board 424. Fault detection circuit 636 latches the fault signal on line 646 to prevent motor 86 from being restarted until reset switch 650 is actuated by the operator. When reset switch 650 is actuated, circuit 636 removes the fault signal from line 646, indicator lamp 433 is de-energized, and motor 86 can be restarted.

Figure 19:
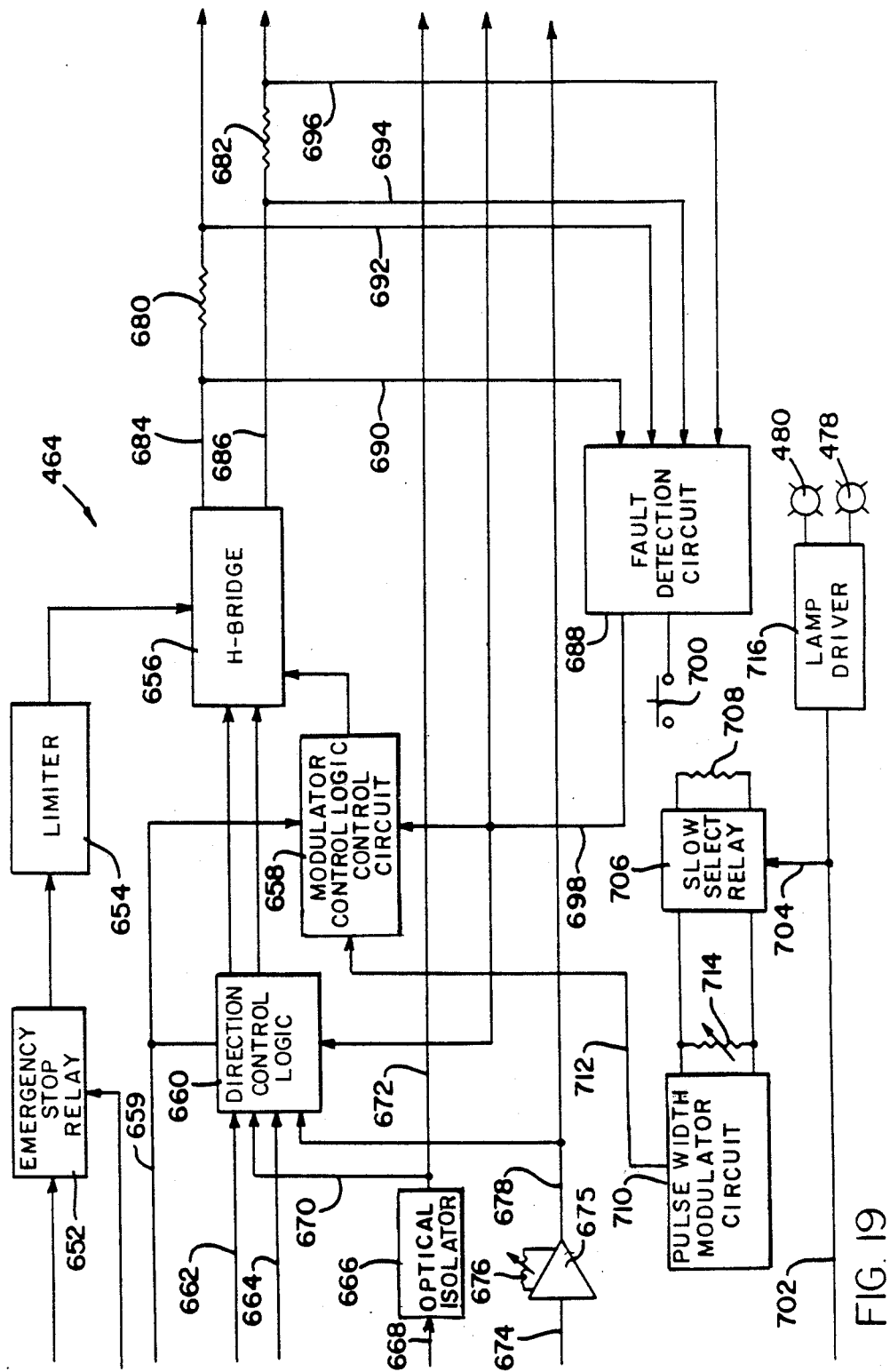
FIG. 19 is a schematic diagram of the index plate control circuit of the module shown in FIG. 20.

FIG. 19 shows indexer plate control board 464. Control board 464 includes pulse width modulator control logic circuit 658 and FET H-bridge 656 H-bridge 656 drives motor 232 either in a direction that causes indexer plate 60 to move toward stator 32 or away from stator 32. Direction control logic 660 receives direction signals on lines 662 and 664. The signal on line 662 commands direction control circuit 660 to turn motor 232 in a direction that moves index plate 60 away from stator 32. The signal on line 664 commands direction control logic 660 to rotate motor 232 in a direction that moves indexer plate 60 toward stator 32.

Emergency stop relay 652 and current limiter 654 are identical to relay 606 and limiter 614 shown in FIG. 18, with the exception that limiter 614 limits motor 86 to 3.0 amps and limiter 654 limits motor 232 to 1.5 amps. Optical isolator 666 receives a signal on line 668 from sensor 282 that indicates that indexer plate 60 has been fully retracted and is in the HOME position. When such a signal is received on line 668, direction control 660 is commanded to stop rotation of motor 232 to halt indexer plate 60 travel by a signal on line 670. Optical isolator 666 provides an interface and isolation between sensor 282 and direction control 660.

When a HOME signal is received on line 668, optical isolator 666 produces a signal on line 672 that informs computer 52 that indexer plate 60 has reached its HOME position. When indexer plate 60 has reached its EXTEND position, in which carriage 32 is in a position to enter a stator 32 slot, sensor 280 produces an EXTEND signal on line 674.

Amplifier 675 includes sensitivity adjustment 676 to compensate for varying distances between sensor 280 and stator 32 to insure that a consistent signal input is produced to direction control circuit 660 and computer 52. Amplifier 676 produces a signal on line 678, when an EXTEND signal is produced on line 674, that instructs direction control circuit 660 to stop operation of motor 232 and informs computer 52 that indexer plate 60 has reached its EXTEND position and that motor 232 is not operating.

Resistors 680 and 682 are inserted in lines 684 and 686, which communicate electrically with the leads of motor 232. Fault detection circuit 688 receives the voltage across resistors 680 and 682 via lines 690, 692, 694, and 696. Fault detection circuit 688 is identical to fault detection circuit 636 shown in FIG. 18, and, when the voltage across resistors 680 and 682 are not equal to each other, produces a FAULT signal on line 698 that causes pulse width modulator circuit 658 to shut down motor 232. The fault signal on line 698 is latched until the operator actuates reset switch 700 located on the front panel of module 418.

Before a fast or slow speed for motor 232 can be selected, computer 52 must first enable circuits 658 and 660 by activating indexer plate enable signal on line 659.

Pulse width modulator circuit 710 operates motor 232 in its FAST mode unless a SLOW signal is received on line 702 from computer 52. The SLOW signal on line 702 is received by slow select relay 706 on line 704. The SLOW signal on line 704 causes resistor 708 to be injected in the circuit, and pulse width modulator circuit 710 reduces the duty cycle of its output on line 712. The reduced duty cycle of the signal on line 712 causes circuit 658 to operate motor 232 in its SLOW mode. Potentiometer 714 is provided to further adjust the duty cycle of the signal on line 712 to adjust the speed of rotation of motor 232 in its FAST mode. The SLOW signal from computer 52 on line 702 causes lamp driver 716 to energize SLOW indicator lamp 478. Absence of the SLOW signal on line 702 causes driver 716 to energize FAST indicator lamp 480.

FIG. 21 shows the acoustic sensor signal conditioner circuit Acoustic sensor 198 produces a distorted sine wave of a frequency that depends on the tightness of the wedge undergoing inspection. The distorted sine wave is applied to analog buffer 722 along line 720. Buffer 722 permits reception of the distorted signal without loading down the signal. The buffered acoustic signal is applied to differentiator 728 along line 724 and window detector circuit 736 along line 726. Differentiator 728 differentiates the acoustic signal appearing on line 724. The differentiated acoustic signal is applied to zero-cross detector 732 along line 730.

Zero-cross detector 732 produces a pulse on line 734 each time the differentiated acoustic signal on line 730 crosses zero. Accordingly, the time occurring between the rising edges of pulses on line 734 represents the time occurring between zero slope points along the signal carried by line 720. The closer together the rising edges of the pulses on line 734, the tighter the wedge undergoing inspection The rising edge of each pulse on line 734 indicates the zero crossing of the signal on line 730. Computer 52 measures the time period between each pulse on line 734.

Circuits 736 and 740 provide information to computer 52 pertaining to the timing of the wedge tightness inspection process When computer 52 releases impactor 166, and impactor 166 hits a wedge, sensor 198 produces an acoustic signal that is received by window detector circuit 736 along line 726. When the acoustic signal on line 726 exceeds a predetermined threshold, circuit 736 produces along line 738 a signal that causes digital latch 740 to produce a trigger signal on line 742.

The trigger signal on line 742 is transmitted to computer 52, which interprets the presence of a trigger signal as indicating that acoustic data is forthcoming. Computer 52 then samples 8 pulses on line 734, at which time computer 52 removes from solenoid 196 the signal that caused impactor 166 to impact the wedge. At that point, computer 52 resets the trigger signal and resets the timing circuit described above.

Board 446 energizes indicator lamps on operator control panel 414 that indicate:
(1) operation of encoder 406 channel A;
(2) operation of encoder 406 channel B;
(3) mirror rotation to clockwise limit;
(4) mirror rotation to counterclockwise limit.

Camera focus board 454 and mirror tilt board 456 are identical to mirror rotate control board 446 with the exception that they do not include the encoder logic shown in FIG. 16.

Primary motor control board 462 of indexer control module 418 is identical to primary control board 424 of carriage control module 416 shown in FIGS. 17 and 18.

Lamination integrity lift motor board 502 and wedge tightness lift motor control board 504 are identical to motor controllers 454 and 456 shown in FIG. 13.

Operation of the apparatus and electronic system described above can be implemented by any suitable computer software A functional description of computer software particularly useful with the preferred embodiment is provided below, from which suitable computer programs easily can be generated. The system can be operated generally in four active modes, lamination integrity, wedge tightness, visual, and manual.

The program includes a top level mode, main, from which the operator can choose one of the four active modes. The system includes one additional mode, initialization mode, in which the operator aligns indexer 58 with a slot and identifies the slot number for computer 52. Computer 52 reads the position from indexer main drive motor position transducer 234 and considers that reading to be the HOME, or reference, position.

When operating the system, the operator enters the main mode and identifies the following:

(1) customer site name;
(2) operator name;
(3) plant code;
(4) generator number;
(5) site code;
(6) any additional desired comments.

Once that data has been entered, computer 52 displays on computer CRT 48 four active modes and the initialization mode. The system is designed to prevent the operator from selecting any of the four active modes until the operator had entered generator information and indexer HOME position information. Upon returning to main from the initialization mode, the operator is given the choice of entering one of the four active modes.

Upon entering the lamination integrity mode, the operator is given the option of entering three submodes, scan process, graph-stored data, and return to main. Return to main permits the operator to return to the top level mode, main. The scan process mode permits the operator to initiate a lamination integrity inspection. Upon entering the scan process submode, the operator provides the following to computer 52 via an initialization screen:

(1) number of the slot to be inspected;
(2) length of slot to be scanned, in inches;
(3) speed, in inches per second, at which the lamination integrity apparatus will travel during the inspection;
(4) sampling rate, in inches;
(5) name of the computer file that will store the information developed during the scan;
(6) current range setting;
(7) whether the carriage should return to its HOME position upon completion of the scan;
(8) speed, in inches per second, at which the carriage should return to the HOME position;
(9) pan increment, in inches;
(10) cursor increment.

Upon completion of the initialization process described above, the operator initiates the scan. Indexer 58, indexer plate 60, and carriage 62 have been previously moved to the inspection site using the manual mode described below. Upon initiation of the scan, computer 52 moves carriage 62 through the specified distance during which lamination integrity information is acquired and, if desired, stored.

Also, during the scan, computer 52 displays graphs of acquired data. Computer 52 produces the graphs on screen 48. Upon initiation of the scan process, lamination insulation integrity inspection ("LIII") assembly 143 is raised and ferrite plugs 142 contact stator 32. Then, carriage 62 begins to move and data is collected. As data is collected, it is displayed on screen 48. Voltage generated by lamination integrity coils 112 is displayed versus slot position.

Three graphs are provided, representing data acquired from three slots. The data from two slots previously scanned and the slot currently under inspection are graphed. The display also provides position and current fields that are continuously updated as coils 112 move along the slot, slot number, the zoom factor, and an indication of which of the three graphs represents information currently being obtained from a slot.

Upon completion of the scan, carriage 62 either returns to its HOME position, if the operator so chose during initialization, or carriage 62 simply stops to await further instructions. If the operator chose to store the acquired data, computer 52 creates a file name and stores the data in a file under that name along with the slot number and the time of day at which the data was collected.

The graph stored data submode permits the operator to display on screen 48 a graph of data acquired earlier. Upon entering this submode, the operator can display a directory of files previously created. The operator may enter the name of up to three files whose data should be graphed. The operator also enters the zoom factor, the pan increment in inches, and the cursor increment in data points, although default values are provided. The graphs are then displayed. The operator then has the option to enter the graphics mode, in which the operator can manipulate the graph displayed on the operator screen by panning and zooming.

The graphics mode is a conventional program that can be readily constructed by one of ordinary skill in the art. The graphics mode performs essentially four functions. Using the graphics mode, the operator can zoom in on data displayed on the screen. That is, a portion of the graph can be chosen and amplified to encompass the entire available graph on the screen.

After amplification has occurred, the operator can pan the graph to the left or right to display amplified data that was outside the portion originally chosen with the zoom feature. Also, the cursor, or cross hair, can be moved to the left or right to display the current reading and position. Finally, the screen, as displayed, can be printed. A more detailed description of the scan process submode of the lamination integrity mode is provided below, in numbers step form:

(1) Initialize analog to digital("A/D") convertor—the A/D receives analog data from lamination integrity coils 112 and converts the data to digital signals
(2) Has the process scan been completed? The scan is complete when carriage 62 stops or reaches HOME at the end of a scan, or when the operator has chosen to exit the lamination integrity mode. If the scan process has ended, the scan is complete and the system displays, on screen 48, the modes for choice by the operator.
(3) If the answer in Step (2) is "yes", the scan process submode ends and the operator is given the choice of which submode under lamination integrity mode to enter.
(4) If the answer in Step (2) is "no", the lamination integrity initialization screen is displayed.
(5) Initialize operator's screen to display a real-time plot—the operator's screen is prepared to display the graphs and data pertaining to a lamination integrity scan.
(6) Determine whether carriage 62 may be moved by checking the carriage front and back overtravel sensors 402 and 404.
(7) Ascertain and eliminate the effects of background noise from the A/D convertor.
(8) Command the lamination integrity lift motor 212 to lift lamination integrity assembly 143.
(9) Read the lamination integrity channel of the A/D convertor.
(10) Check carriage main drive motor 86 for error conditions.
(11) Energize lamination integrity cycle LED on operator control panel 414 to indicate a scan is in progress.

(12) Is the scan still in progress?. If not, proceed to Step (23) below. If so, proceed to Step (13) below.
(13) Display on screen 48 present carriage 62 position and slot number.
(14) Check the computer keyboard for operator input to determine whether the operator has ordered carriage 62 to a controlled stop or to an immediate stop. If the operator has ordered a controlled stop, carriage 62 is decelerated to a stop and awaits further instructions. The operator can either return to the HOME position or continue the scan. If the operator has ordered an immediate stop, carriage 62 immediately stops and the operator may return carriage 62 to the HOME position.
(15) Read main drive motor encoder 340 to determine current carriage 62 position from HOME, in inches.
(16) Determine whether the forward scan is complete using the position information obtained in Step (15).
(17) Check carriage main drive motor 86 to determine the presence of any errors.
(18) Check carriage front and back sensors 402 and 404 to determine whether carriage 62 may be moved. If carriage 62 may not be moved forward, carriage 62 will stop and may be returned to the HOME position.
(19) Has carriage 62 travelled the specified distance since the last measurement?. If not, proceed to Step (12) above. If so, proceed to Step (20) below.
(20) Read the voltage from lamination integrity coils 112 via the A/D convertor.
(21) Display the current position and the present current flowing through lamination integrity coils 112, calculated from the voltage read in Step (20), in graph form on screen 48.
(22) Store the position and voltage data in resident memory and proceed to Step (12) above.
(23) Since the scan has been completed, de-energize the lamination integrity cycle ON LED energized in Step (11) above.
(24) LIII assembly 143.
(25) During lamination integrity initialization, did the operator specify that the carriage should return to HOME after the forward scan?. If not, proceed to Step (30) below. If so, proceed to Step (26) below.
(26) Determine whether the operator wishes to scan while carriage 62 returns to the HOME position. If the operator answers in the negative, proceed to Step (28) below. If the operator answers in the affirmative, proceed to Step (27) below.
(27) Return carriage 62 to the HOME position while scanning. During this procedure, return scan data is laid over the forward scan data on screen 48.
(28) Return carriage 62 to the HOME position without scanning.
(29) Store the data acquired on disk.
(30) Enter graphics mode and remain there until operator exits.
(31) Disable carriage main drive motor 86.

The details of the graph stored data submode of the lamination integrity mode are described, in numbered step form, below:
(1) Display graph initialization screen. The screen allows the operator to enter three file names corresponding to data that the operator wishes to display in graph form.
(2) Display lamination integrity graph template The computer displays a screen that is blank with the exception of three sets of graph axes.
(3) Retrieve desired data from disk. The computer retrieves position and voltage data from the three files selected
(4) Calculate and display graph scale.
(5) Initialize the graphics mode.
(6) Display the screen labels, including the current and position ranges and the file names.
(7) Enter graphics mode and remain there until exited by the operator.
(8) Return to lamination integrity mode.

The wedge tightness mode includes three submodes, inspection process, graph-stored data, and return to main. As with lamination integrity mode, return to main simply returns control to the top level main mode. The inspection process submode permits the operator to perform a wedge tightness inspection. A wedge tightness inspection is conducted by moving indexer 58 to the desired slot and moving indexer plate 60 into registration with the slot.

Carriage 62 is moved along the slot to the desired wedge and the wedge is hit by wedge tightness impactor 166 several times. Acoustic data is collected, wedge tightness assembly 199 is lowered to its RETRACT position, and carriage 62 is moved by computer 52 one-eighth of an inch forward and the sequence is repeated seven additional times.

Accordingly, carriage 62 travels one inch during a complete wedge tightness inspection. During the inspection, computer 52 graphs and tabulates on screen 48 the gathered acoustic data. During the process, computer 52 displays a matrix. Each row of the matrix consists of data gathered from one of the eight impact sites.

Computer 52 displays seven values for the time occurring between peaks of the acoustic signal created at each impact site. Computer 52 also displays a graph showing the acoustic signal generated at the current impact site. During initialization of the inspection process, an initialization screen is generated that requests whether default values for slot number, wedge number, and cursor increment are desired.

If default values are not desired, the operator enters the slot number, wedge number, and cursor increment. Computer 52 then instructs the operator to use the jog submode to position carriage 62 under the wedge that is to be inspected.

The graph-stored data submode of the wedge tightness mode is similar to the graph-stored data submode of the lamination integrity mode. Upon entering the graph-stored data mode, computer 52 asks the operator whether the operator wishes to display a directory showing the file names of all wedge tightness data previously stored on disk. If so, computer 52 displays the directory. If not, the operator enters the file name and indicates whether default values for pan increment, cursor increment, or zoom factor are desired. If they aren't, the operator may enter the values for pan increment, cursor increment, or zoom factor.

Subsequently, computer 52 displays the matrix of time and current information that was gathered previously for a one-inch segment of a wedge. The operator may choose which row of data should be displayed on the graph.

The detailed operation of the inspection process submode of the wedge tightness mode is presented, in numbered step form, below:

(1) Display wedge tightness initialization screen.
(2) Allocate memory in which acoustic data from the wedge tightness channel of the A/D convertor will be stored.
(3) Identify the address at which computer 52 will begin reading data from the A/D convertor.
(4) Set the rate at which the A/D convertor will be triggered to read data gathered from acoustic sensor 198.
(5) Identify which of the nine channels of the A/D convertor will contain acoustic data.
(6) Set the interrupt vector to permit generation of eight interrupts.
(7) Display the instructions to the operator to move carriage 62 to the desired impact sight.
(8) Allow the operator to use the jog submode to move carriage 62 to the first impact sight.
(9) Create the file name for time data that will be stored on disk.
(10) Has the operator initiated a stop of the inspection, has an error occurred that should stop the inspection, or have all eight impact sites been impacted? If so, proceed to Step (12) below. Otherwise, proceed to Step (11) below.
(11) Does the operator wish to continue with wedge tightness data collection, move carriage 62, or exit the scan process submode to return to the main menu?. If the operator wishes to either move carriage 62 or return to the main menu, proceed to Step (38) below. Otherwise, proceed to Step (12) below.
(12) Has the operator decided to stop the inspection, has an error condition occurred, or have all eight impacts been completed?. If so, exit the inspection process submode and return to wedge tightness mode. Otherwise, proceed to Step (13) below.
(13) Create a file name for the acoustic data that will be stored on disk.
(14) Display the template screen, that is, a screen that is blank with the exception of the graph axes.
(15) Disable indexer main drive motor 116 and carriage main drive motor 86 to prevent indexer 58 and carriage 62 from moving.
(16) Energize an LED on operator control panel 414 that indicates that the wedge tightness inspection is in process.
(17) Activate wedge tightness assembly lift motor 210 to position impactor 166 under the wedge.
(18) Activate impactor 166 several times in succession to cause impactor 166 to hit the wedge several times.
(19) Read the acoustic data generated by the impacts into the direct memory access area set aside in Step (9).
(20) Check all digital inputs to the computer.
(21) Enable the interrupt handler to inform computer 52 that an interrupt is imminent.
(22) Wait until all acoustic data is stored in memory.
(23) Lower wedge tightness assembly 199.
(24) Display the acoustic data on the screen, both graphic data and time values.
(25) Save the time values in resident memory.
(26) Turn off the LED that indicates that wedge tightness data collection is complete.
(27) Save the acoustic data in resident memory.
(28) Initialize the graphics mode.
(29) Calculate the screen scales.
(30) Enter graphics mode and remain there until the operator chooses to exit.
(31) Does the operator wish to proceed to the next impact site, return to main mode, or collect acoustic data from the current impact site?. If the operator wishes to collect more acoustic data from the current impact site, or return to the main mode, proceed to Step (35) below. Otherwise, proceed to Step (32) below.
(32) Transfer acoustic data from resident memory to disk.
(33) Transfer the time values from resident memory to disk.
(34) Does the operator wish to re-impact the current impact site or return to main mode?If the operator wishes to return to main mode, proceed to Step (37) below. Otherwise, proceed to Step (36) below.
(35) Move carriage 62 one-eighth of an inch into the slot. Proceed to Step (12) above.
(36) Permit the operator to move carriage 62 using the jog submode, and then proceed to Step (12). inspection process has been completed Return to Step (12) above.

The details of the graph-stored data submode of the wedge tightness mode are presented below in numbered step form:
(1) Display wedge tightness graph subsystem initialization screen. Provide file name directory if desired.
(2) Display template screen, that is, a blank screen with the exception of the graph axes.
(3) Display the cursor box.
(4) Acquire the graph corresponding to the desired file name from disk and read into resident storage.
(5) Display the graph and enter the graphics mode; remain there until the operator exits.
(6) Return to wedge tightness mode.

The visual mode includes two submodes, mirror calibration and return to main. Return to main permits the operator to return to the top level main mode. The mirror calibration submode is used to calibrate mirror 108 position when the inspection system is first powered up. Since mirror rotate encoder 406 provides relative, rather than absolute, position information, mirror rotation calibration is required.

When the operator enters the mirror calibration submode, computer 52 displays instructions to the operator to move mirror 108 to its clockwise limit. When mirror rotation clockwise limit switch is activated, computer 52 reads the encoder value, which it assumes is the clockwise limit Upon power up, computer 52 prevents the video display from being activated without calibrating mirror 108 position.

The manual mode permits manual operation of carriage 62, indexer 58, and indexer plate 60. The manual mode includes six submodes, carriage jog, carriage manual, indexer jog, indexer manual, jog indexer plate, and return to main. Selecting return to main submode permits the operator to return to the to level main mode. Generally, when using any of the jog submodes, the apparatus under control can be moved manually by the operator.

The operator control panel includes two jog switches, which are used to jog carriage 62, indexer 58, and indexer plate 60. Each switch moves the apparatus in a different direction, but only as long as the switch is depressed. In the automatic mode, the operator indicates the position to which the apparatus should be moved, and computer 52 moves the apparatus until the required position is reached.

Upon entering the carriage jog submode, the computer displays on screen 48 the current carriage position in inches, the desired carriage velocity in inches per second, and instructions pertaining to the direction of movement initiated by actuation of each jog switch. The operator enters the desired velocity in inches per second When either jog switch is actuated, carriage 62 moves in the commanded direction until the operator releases the jog button, until carriage 62 reaches the end of a slot, until an emergency stop is generated by the operator at operator control panel 414, or until a carriage main drive motor 86 fault occurs. The carriage jog LED on operator control panel 414 is energized when carriage 62 is being jogged.

The following checks are made anytime carriage 62, indexer 58, or indexer plate 60 are moving:
(1) end of slot front and back carriage sensors 402 and 404;
(2) emergency stop initiated by operator;
(3) lamination integrity assembly 143 is lowered;
(4) wedge tightness assembly 199 is lowered;
(5) motor faults;
(6) carriage 62 is not hardware disabled;
(7) indexer plate 60 is against stator 32 if carriage 62 has been commanded to move;
(8) indexer plate 60 is retracted from stator 32 if indexer 58 has been commanded to move.

The carriage manual submode permits the operator to move carriage 62 automatically to a desired position. When the carriage manual submode is entered, a screen is displayed that requests the position, in inches, to which carriage 62 should be moved and the velocity at which carriage 62 should move to the desired position As computer 52 moves carriage 62 to the desired position, a screen is displayed on which carriage 62 position and velocity is updated.

The indexer jog submode permits the operator to move indexer 58 clockwise or counterclockwise around the rotor retaining ring. One jog switch on operator control panel 414 moves indexer 58 in the clockwise position and the remaining jog switch moves indexer 58 in a counterclockwise direction. When the operator is jogging indexer 58, computer 52 displays the updated position and velocity information.

The indexer manual submode permits the operator to move indexer 58 by identifying the number of the slot to which computer 52 should move indexer 58 and the velocity at which indexer 58 should be moved As indexer 58 is moving, computer 52 displays the current slot position and the velocity at which indexer 58 is moving.

The jog indexer plate submode permits the operator to move indexer plate 60 toward and away from stator 32. Also, a FAST/SLOW speed change capability is provided on operator control panel 414, which can be used to move indexer plate 60 at either a fast or slow speed. An indicator light is energized on operator control panel 414 when indexer plate 60 is being moved.

While for purposes of clarity, the present invention has been described with respect to a particular generator which incorporates two sets of teeth, it may be appreciated by those skilled in the art, that the present invention may be adapted to function in cooperation with a wide variety of different models of generators.

Whereas particular embodiments of the invention have been described for purposes of illustration, it will be evident to those skilled in the art that numerous variations of the details may be made without departing from the invention as defined in the appended claims.

What is claimed is:

1. An inspection system for an electric generator comprising:
apparatus for inspecting and providing information pertaining to the tightness of the stator coil wedges of the generator including impactor means for striking the coil wedges of the generator thereby generating an acoustical signal responsive thereto and electrical means for recording and analyzing the frequency of the acoustical signal and for computing an adjusted average of the frequency of more than one said acoustical signal which is inversely proportional to the tightness of said wedge;
means for delivering said apparatus to the site of inspection, and for retrieving said apparatus therefrom; and
means for causing said apparatus to conduct an inspection at an inspection site.

2. The system of claim 1 wherein said electrical means further comprises conditioner means arranged to receive said acoustical signal for buffering and differentiating thereby producing a differentiated signal.

3. The system of claim 2 wherein said conditioner means further comprises a zero-cross detector for receiving said differentiated signal and for producing a plurality of pulses one for each time interval said differentiated signal has a zero slope whereby the time between said pulses is representative of the tightness of said wedge.

4. The system of claim 3 wherein said impactor means comprises a solenoid for impacting a face of said wedge thereby generating said acoustical signal.

5. The system of claim 4 wherein said electrical means comprises an acoustic sensor for receiving said acoustical signal.

6. The system of claim 5 wherein said acoustic sensor is a microphone for detecting said acoustical signal.

7. The system of claim 6 wherein said means for delivering said apparatus to the site of inspection, and for retrieving said apparatus therefrom includes carriage means.

8. An inspection system for an electric generator comprising:
a carriage adapted to travel along the slots defined by the stator of the generator;
electrical means mounted on said carriage for inspecting and providing information pertaining to the tightness of the stator coil wedges of the generator;
means for moving said carriage along the stator slots to sites of inspection;
an indexer adapted to be releasably secured to the rotor of the generator, said carriage and said indexer being adapted to permit said carriage to be received and retained by said indexer when said carriage exits a slot;
means for aligning said indexer with each slot to permit said carriage to enter the slot when said carriage travels out of retention of said indexer;
means for moving the indexer around the circumference of the rotor to deliver said carriage to a desired slot; and
means for causing said electrical means to conduct an inspection at an inspection site.

9. The system of claim 8 wherein said electrical means for inspecting and providing information pertaining to the tightness of the coil wedges of the generator includes impactor means for striking the coil wedges of the generator and generating an acoustical signal responsive thereto.

10. The system of claim 9 wherein said electrical means for inspecting and providing information pertaining to the tightness of the coil wedges of the generator includes means for recording and analyzing the acoustical signal generated by said impactor means.

11. The system of claim 10 wherein said electrical means comprises an acoustic sensor for receiving said acoustical signal.

12. The system of claim 11 wherein said electrical means further comprises means for computing an adjusted average of the frequency of more than one acoustical signal which is inversely proportional to the tightness of said wedge.

13. The system of claim 12 wherein said electrical means further comprises conditioner means arranged to receive said acoustical signal for buffering and differentiating thereby producing a differentiated signal.

14. The system of claim 13 wherein said conditioner means further comprises a zero-cross detector for receiving said differentiated signal and for producing a plurality of pulses one for each time interval said differentiated signal has a zero slope whereby the time between said pulses is representative of the tightness of said wedge.

15. The system of claim 14 wherein said impactor means comprises a solenoid for impacting a face of said wedge thereby generating said acoustical signal.

16. The system of claim 15 wherein said acoustic sensor is a microphone for detecting said acoustical signal.

17. A system for inspection and providing information pertaining to the tightness of the stator coil wedges of an electrical generator comprising:
    impactor means for striking the coil wedges and generating an acoustical signal responsive thereto;
    an acoustic sensor arranged near said coil wedges for receiving said acoustical signal; and
    electrical means associated with said acoustic sensor for recording, analyzing, and computing an adjusted average of the frequencies of more than one acoustical signal generated by said impactor means which average is inversely proportional to the tightness of said wedges.

18. The system of claim 17 wherein said electrical means further comprises conditioner means arranged to receive said acoustical signal for buffering and differentiating thereby producing a differentiated signal.

19. The system of claim 18 wherein said conditioner means further comprises a zero-cross detector for receiving said differentiated signal and for producing a plurality of pulses one for each time interval said differentiated signal has a zero slope whereby the time between said pulses is representative of the tightness of said wedge.

20. The system of claim 19 wherein said impactor means comprises a solenoid for impacting a face of said wedge thereby generating said acoustical signal.

21. The system of claim 20 wherein said acoustic sensor is a microphone for detecting said acoustical signal.

* * * * *